United States Patent
Watanabe et al.

(10) Patent No.: US 9,331,282 B2
(45) Date of Patent: May 3, 2016

(54) CONJUGATED POLYMER, AND ELECTRON DONATING ORGANIC MATERIAL, MATERIAL FOR PHOTOVOLTAIC DEVICE AND PHOTOVOLTAIC DEVICE USING THE CONJUGATED POLYMER

(71) Applicant: Toray Industries, Inc., Tokyo (JP)

(72) Inventors: Nobuhiro Watanabe, Otsu (JP); Daisuke Kitazawa, Otsu (JP); Shuhei Yamamoto, Otsu (JP); Satoru Shimomura, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/425,176

(22) PCT Filed: Sep. 6, 2013

(86) PCT No.: PCT/JP2013/074070
§ 371 (c)(1),
(2) Date: Mar. 2, 2015

(87) PCT Pub. No.: WO2014/042090
PCT Pub. Date: Mar. 20, 2014

(65) Prior Publication Data
US 2015/0249214 A1    Sep. 3, 2015

(30) Foreign Application Priority Data

Sep. 14, 2012    (JP) .................. 2012-202264
Feb. 4, 2013    (JP) .................. 2013-019105
May 29, 2013    (JP) .................. 2013-112559

(51) Int. Cl.
*C08G 61/12*    (2006.01)
*H01L 51/00*    (2006.01)
*H01L 51/42*    (2006.01)
*B82Y 10/00*    (2011.01)
*H01L 51/44*    (2006.01)

(52) U.S. Cl.
CPC ............. *H01L 51/0036* (2013.01); *B82Y 10/00* (2013.01); *C08G 61/126* (2013.01); *H01L 51/0043* (2013.01); *H01L 51/42* (2013.01); *C08G 2261/12* (2013.01); *C08G 2261/124* (2013.01); *C08G 2261/146* (2013.01); *C08G 2261/149* (2013.01); *C08G 2261/1412* (2013.01); *C08G 2261/1424* (2013.01); *C08G 2261/1426* (2013.01); *C08G 2261/1428* (2013.01); *C08G 2261/18* (2013.01); *C08G 2261/3223* (2013.01); *C08G 2261/3243* (2013.01); *C08G 2261/414* (2013.01); *C08G 2261/514* (2013.01); *C08G 2261/91* (2013.01); *H01L 51/0037* (2013.01); *H01L 51/0046* (2013.01); *H01L 51/0047* (2013.01); *H01L 51/4253* (2013.01); *H01L 51/441* (2013.01); *Y02E 10/549* (2013.01)

(58) Field of Classification Search
CPC .............. Y02E 10/549; H01L 51/0036; H01L 51/0043; H01L 51/0046; H01L 51/0047; H01L 51/42; C08G 2261/12; C08G 2261/1428; C08G 2261/146; C08G 2261/18; C08G 2261/3223; C08G 2261/3243; C08G 2261/514; C08G 2261/91; C08G 61/126
See application file for complete search history.

(56) References Cited

FOREIGN PATENT DOCUMENTS

| CN | 101432901 | 5/2009 |
| CN | 102160207 | 8/2011 |
| WO | 2011/011545 | 1/2011 |
| WO | 2013/116643 | 8/2013 |
| WO | 2013/123157 | 8/2013 |

OTHER PUBLICATIONS

Alem, et al., Degradation Mechanism of Benzodithiophene-Based Conjugated Polymers when Exposed to Light in Air, ACS Applied Materials & Interfaces, vol. 4, pp. 2993-2998 (2002).*
Zhou, H., et al., "Rational Design of High Performance Conjugated Polymers for Organic Solar Cells," Macromolecules, vol. 45, p. 607-632, 2012.
Bundgaard, E., et al., "Low band gap polymers for organic photovoltaics," Solar Energy Materials & Solar Cells, vol. 91, p. 954-985, 2007.
Huo, L., et al., "Replacing Alkoxy Groups with Alkylthienyl Groups: A Feasible Approach to Improve the Properties of Photovoltaic Polymers," Angewandte Chemie International Edition, 2011, vol. 50, pp. 9697-9702.
Alem, S., "Degradation Mechanism of Benzodithiophene-Based Conjugated Polymers when Exposed to Light in Air," ACS Applied Materials & Interfaces, vol. 4, 2012, pp. 2993-2998.
Chinese Office Action dated Dec. 15, 2015 of corresponding Chinese Application No. 201380047818.2 along with an English translation.
Chen, H. et al., "Polymer solar cells with enhanced open-circuit voltage and efficiency," Nature Photonics, Nov. 2009, vol. 3, pp. 649-653.
Son, H., et al., "Synthesis of Fluorinated Polythienothiophene-co-benzodithiophenes and Effect of Fluorination on the Photovoltaic Properties," Journal of the American Chemical Society, Jan. 25, 2011, vol. 133, pp. 1885-1894.

* cited by examiner

Primary Examiner — Erich A Leeser
(74) Attorney, Agent, or Firm — DLA Piper LLP (US)

(57) ABSTRACT

The objective of the present invention is to provide a photovoltaic device which has high photoelectric conversion efficiency and an electron-donating organic material which comprises a conjugate polymer having a structure of a thieno[3,4-b']thiophene skeleton with an alkoxycarbonyl group in which a specific alkyl group part is a straight chain alkyl group or an alkanoyl group in which the alkyl group part is a straight chain alkyl group and a benzo[1,2-b:4, 5-b'] dithiophene skeleton with a heteroaryl group.

13 Claims, 2 Drawing Sheets

CONJUGATED POLYMER, AND ELECTRON DONATING ORGANIC MATERIAL, MATERIAL FOR PHOTOVOLTAIC DEVICE AND PHOTOVOLTAIC DEVICE USING THE CONJUGATED POLYMER

TECHNICAL FIELD

This disclosure relates to a conjugated polymer, and an electron donating organic material, a material for a photovoltaic device and a photovoltaic device using the conjugated polymer.

BACKGROUND

Solar cells that provide an environment-friendly electric energy source have drawn public attention as an effective energy source that can solve energy problems that have currently become more and more serious. At present, as a semiconductor material for use in photovoltaic devices for solar cells, inorganic substances such as monocrystalline silicon, polycrystalline silicon, amorphous silicon, and a compound semiconductor, have been used. However, since the solar cell to be produced by using inorganic semiconductors requires high costs, it has not been widely used for general household purposes. The main reason for the high costs lies in that a process of manufacturing a semiconductor thin-film requires high temperature and vacuum conditions. For this reason, organic solar cells have been investigated in which, as a semiconductor material expected to simplify the manufacturing process, an organic semiconductor and an organic dye such as a conjugated polymer and an organic crystal are used.

However, the largest problem with the organic solar cells using the conjugated polymer or the like is that its photoelectric conversion efficiency is low compared to conventional solar cells using inorganic semiconductors, and these solar cells have not been put into practical use. The reasons that the photoelectric conversion efficiency of the organic solar cells using the conventional conjugated polymer is low lie in that the absorbing efficiency of solar light is low, in that a bound state referred to as an exciton state in which electrons and holes generated by solar light are hardly separated is formed, and in that since a trap which captures carriers (electrons and holes) is easily formed, generated carriers are easily captured by the trap, resulting in the slow mobility of carriers.

At present, the conventional photoelectric conversion device based on the organic semiconductors can be classified into a schottky-type structure in which an electron donating organic material (p-type organic semiconductor) and metal having a small work function are joined to each other, and a hetero junction type structure in which an electron accepting organic material (n-type organic semiconductor) and an electron donating organic material (p-type organic semiconductor) are joined to each other. These devices have a low photoelectric conversion efficiency since only the organic layer (only several molecular layer) of the joined portion contributes to photoelectric current generation, and the improvement thereof has been required.

As a method of improving the photoelectric conversion efficiency, there is a method of employing a bulk hetero junction type structure in which an electron accepting organic material (n-type organic semiconductor) and an electron donating organic material (p-type organic semiconductor) are mixed with each other to increase the junction surface contributing to the photoelectric conversion. In particular, a photoelectric conversion device of a bulk hetero junction type has been reported in which a conjugated polymer is used as the electron donating organic material (p-type organic semiconductor), and a conductive polymer having n-type semiconductor characteristics, fullerene such as $C_{60}$ or a fullerene derivative, is used as the electron accepting organic material.

By the way, to efficiently absorb radiating energy which covers a wide range of solar light spectra to improve the photoelectric conversion efficiency, an electron donating organic material with a narrow band gap is useful (for example, refer to E. Bundgaard and F. C. Krebs, "Solar Energy Materials & Solar Cells", Vol. 91, p. 954, 2007 and H. Zhou, L. Yang, and W. You, "Macromolecules", Vol. 45, p. 607, 2012). It is reported that as such a narrow-band-gap electron donating organic material, a copolymer formed by combining a thieno[3,4-b]thiophene skeleton with a benzo[1,2-b:4,5-b']dithiophene skeleton exhibits particularly excellent photovoltaic characteristics, and many derivatives have been synthesized (for example, refer to WO 2011/011545 A).

However, in conventional electron donating organic materials formed by copolymerization of the thieno[3,4-b]thiophene skeleton and the benzo[1,2-b:4,5-b']dithiophene skeleton, sufficient conversion efficiency is not achieved since it is not possible to pursue narrowing of a band gap, high carrier mobility and compatibility with the electron accepting material typified by the fullerene derivatives simultaneously. It could therefore be helpful to provide an electron donating organic material which pursues narrowing of a band gap, high carrier mobility and compatibility with the electron accepting material simultaneously by selecting an optimum substituent and side chain, and provide a photovoltaic device having high photoelectric conversion efficiency.

SUMMARY

We investigated the substituents and side chains of the conjugated polymer composed of the thieno[3,4-b]thiophene skeleton and the benzo[1,2-b:4,5-b']dithiophene skeleton and, consequently, found a structure which improves performance of the electron donating material and increases conversion efficiency of the photovoltaic device.

We thus provide a conjugated polymer having a structure represented by formula (1), an electron donating organic material, a material for a photovoltaic device and a photovoltaic device using the conjugated polymer.

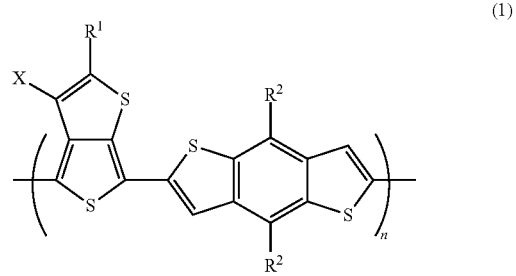

In formula (1), $R^1$ represents an alkoxycarbonyl group in which an alkyl group part is a straight chain alkyl group or an alkanoyl group in which an alkyl group part is a straight chain alkyl group, and these groups may be substituted as long as they maintain a straight chain structure. Each of $R^2$s which may be the same or different represents an optionally substituted heteroaryl group. X represents a hydrogen atom or a halogen atom. n indicates a polymerization degree and represents an integer of 2 or more and 1000 or less.

It is thus possible to provide a photovoltaic device having high photoelectric conversion efficiency.

DESCRIPTION OF REFERENCE SIGNS

Figure 1:
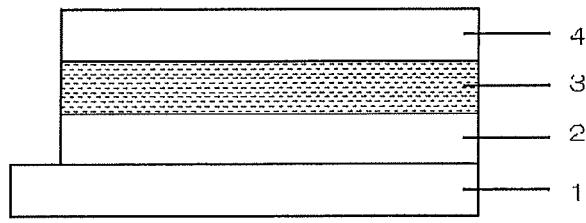
FIG. 1 is a schematic view showing an aspect of a photovoltaic device.

1: Substrate
2: Positive electrode
3: Organic semiconductor layer
4: Negative electrode
5: Layer having an electron donating organic material
6: Layer having an electron accepting organic material

DETAILED DESCRIPTION

A conjugated polymer includes a structure represented by formula (1)

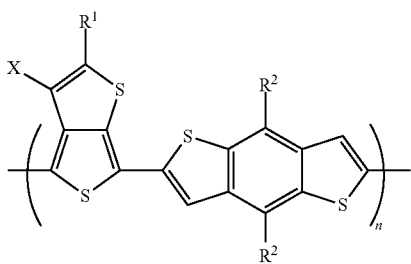

In the above-mentioned formula (1), $R^1$ represents an alkoxycarbonyl group in which an alkyl group part is a straight chain alkyl group or an alkanoyl group in which an alkyl group part is a straight chain alkyl group, and these groups may be substituted as long as they maintain a straight chain structure. By arranging a substituent having a carbonyl group at the 2-position of a thieno[3,4-b]thiophene skeleton, the HOMO level of the conjugated polymer can be deepened, and an open circuit voltage of the photovoltaic device can be increased when the conjugated polymer is used as an electron donating organic semiconductor. The straight chain alkyl group can improve carrier mobility of the conjugated polymer since the straight chain alkyl group can enhance a packing property of a copolymer more than a branched alkyl group.

Each of $R^2$s which may be the same or different represents an optionally substituted heteroaryl group. By introducing a heteroaryl group at a position of $R^2$ of formula (1), planarity of the copolymer can be enhanced, and the carrier mobility of the conjugated polymer can be enhanced.

The alkoxycarbonyl group refers to an alkyl group with an ester bond interposed. The alkanoyl groups refers to an alkyl group with a ketone group interposed.

Further, the straight chain alkyl group is a straight chain saturated aliphatic hydrocarbon groups such as a propyl group, a butyl group, a pentyl group, a hexyl group, a heptyl group, an octyl group, a nonyl group, a decyl group, an undecyl group, and a dodecyl group, and these may be unsubstituted, or may be substituted as long as they maintain a straight chain structure. Moreover, the substituent may be further substituted as long as it maintains a straight chain structure. Examples of the substituent in substitutions while maintaining the straight chain structure include an alkoxy group, a thioalkoxy group, and halogen. The number of carbon atoms of the alkyl group is preferably 4 or more and 10 or less, and particularly preferably 7 or more and 9 or less to pursue sufficient solubility and carrier mobility of the conjugated polymer simultaneously. Halogen as the substituent on the alkyl group has the effect of improving an agglomerated state of the conjugated polymer, and fluorine with a small atomic radius is preferably used.

The heteroaryl group represents an aromatic heterocyclic group having an atom other than carbon atoms such as a thienyl group, a furyl group, a pyrrolyl group, an imidazolyl group, a pyrazolyl group, an oxazolyl group, a pyridyl group, a pyrazyl group, a pyrimidyl group, or a thienothienyl group. The number of carbon atoms of the heteroaryl group used for $R^2$ is preferably 2 or more and 6 or less for maintaining the carrier mobility, and the thienyl group or the furyl group which has a five-membered ring structure with a small molecular size is particularly preferably used to suppress a twist from the benzodithiophene skeleton to enhance the packing property. As the substituent on the heteroaryl group, alkyl groups or alkoxy groups having 6 to 10 carbon atoms is preferred in order to pursue the solubility and carrier mobility of the conjugated polymer simultaneously, and these groups may be straight or branched.

In formula (1), X represents a hydrogen atom or a halogen atom. Halogen refers to any one of fluorine, chlorine, bromine and iodine. A fluorine element having a small atomic radius is particularly preferably used to effectively deepen the HOMO level of the conjugated polymer and also to maintain the packing property.

Further, n indicates a polymerization degree and represents an integer of 2 or more and 1000 or less. When n is set to 5 or more, the carrier mobility of the conjugated polymer can be increased, and an effective carrier path can be formed in a thin film of the above-mentioned bulk hetero junction type and, therefore, the photoelectric conversion efficiency can be increased. n is preferably less than 100 from the viewpoint of ease of synthesis. The polymerization degree can be determined from the weight-average molecular weight. The weight-average molecular weight can be determined by measuring by use of GPC (gel permeation chromatography), and converting the measurement to the polystyrene standard-sample basis. In addition, the thieno[3,4-b]thiophene skeleton may be directed at random or regioregularly in the conjugated polymer.

Many characteristics such as the narrow band gap, the high carrier mobility, the solubility in an organic solvent and the compatibility with the electron accepting material typified by the fullerene derivatives are required of the electron donating organic material in the above-mentioned photovoltaic device of a bulk hetero junction type. The conjugated polymer having a structure represented by formula (1), which is formed by arranging a specific substituent and side chain in a conjugated polymer composed of a thieno[3,4-b]thiophene skeleton and a benzo[1,2-b:4,5-b']dithiophene skeleton, can satisfy all these characteristics, and the conjugated polymer can be preferably used as an electron donating organic material in the photovoltaic device of the bulk hetero junction type.

Specific examples of the conjugated polymer having the structure represented by formula (1) include following structures. n represents an integer of 2 or more and 1000 or less.

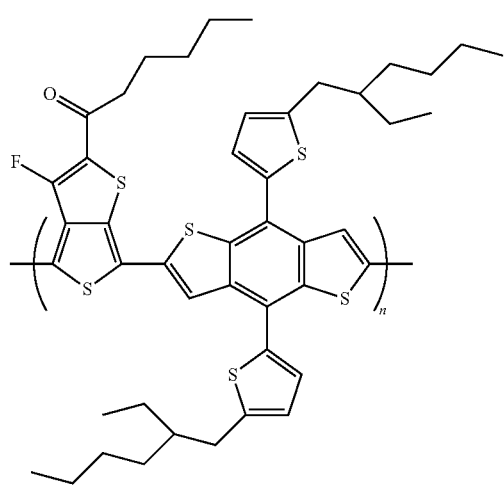
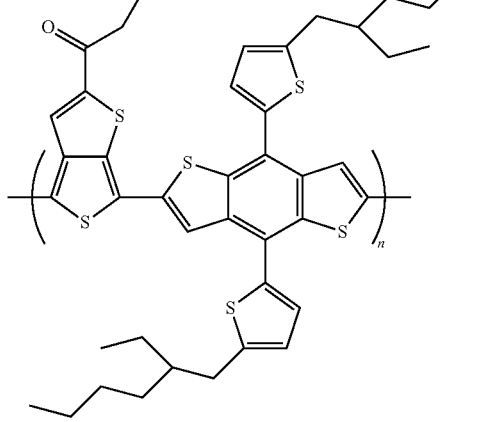
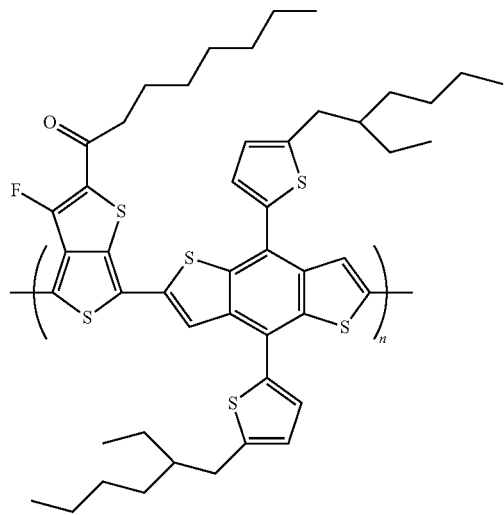
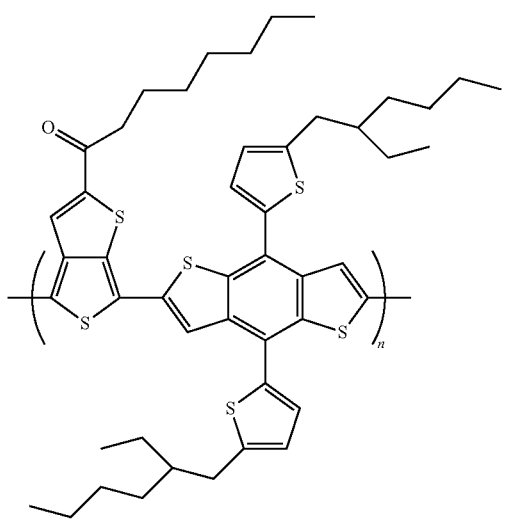
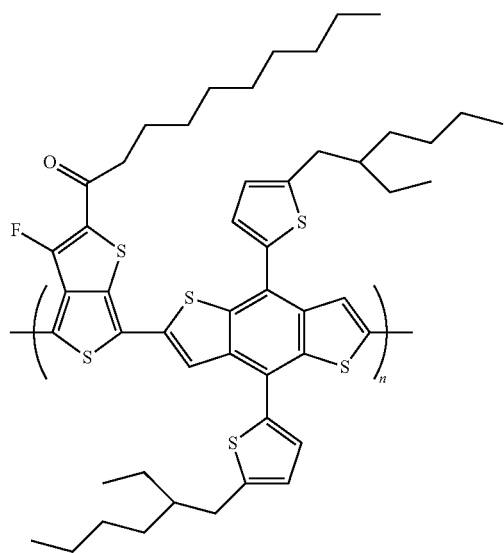
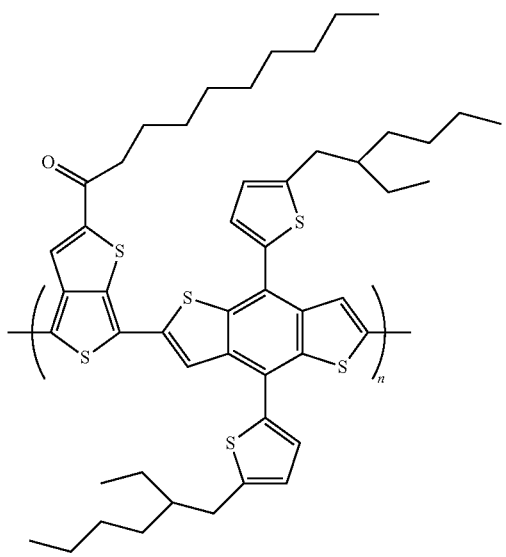

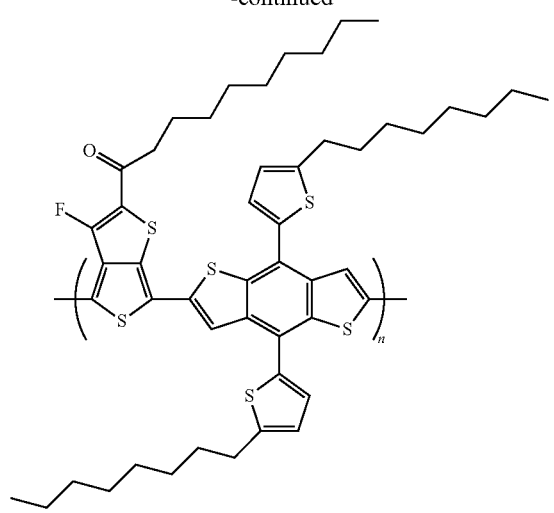
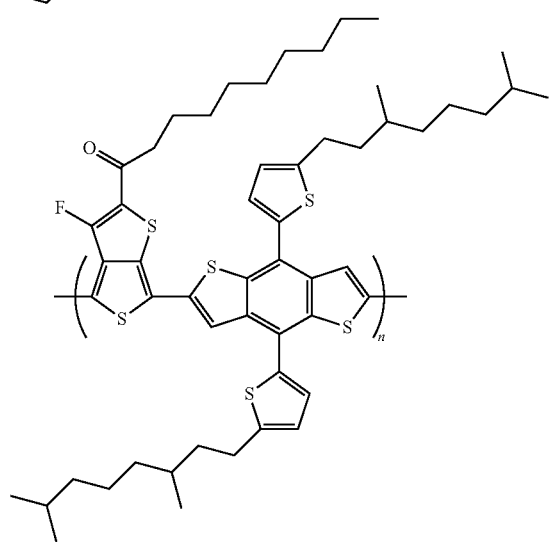
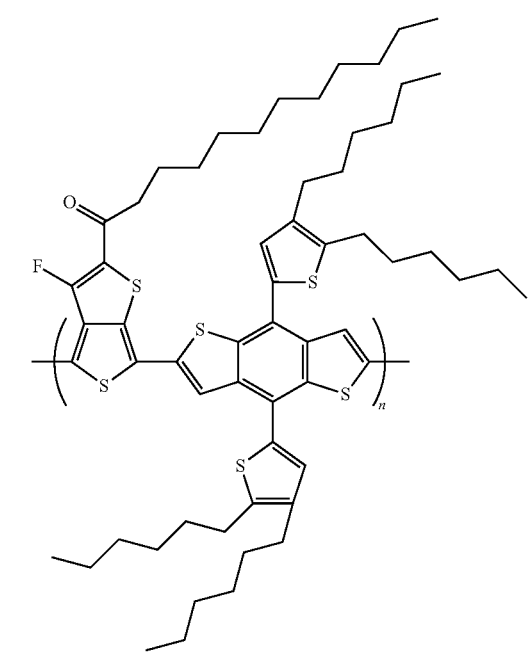
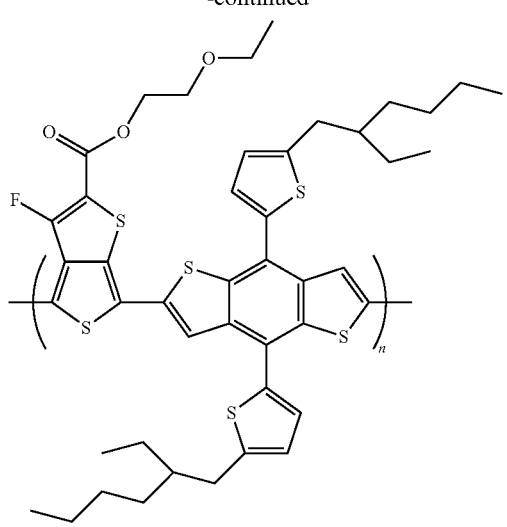
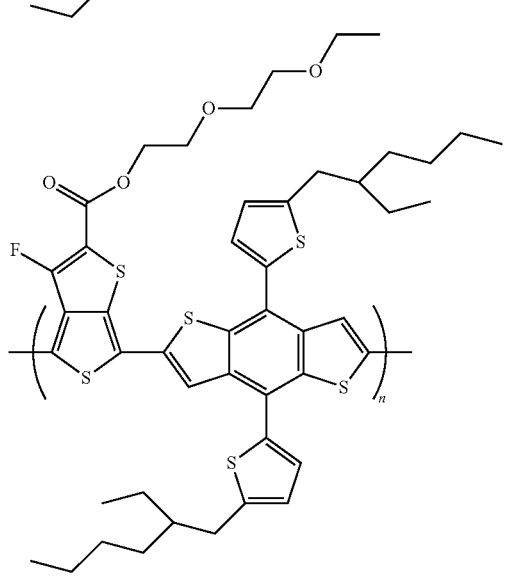
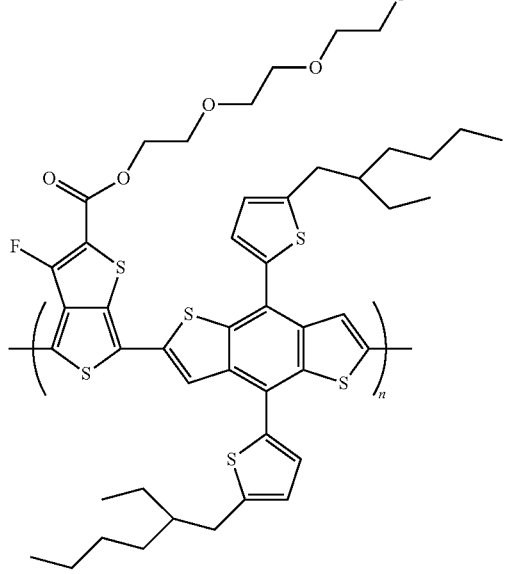

-continued
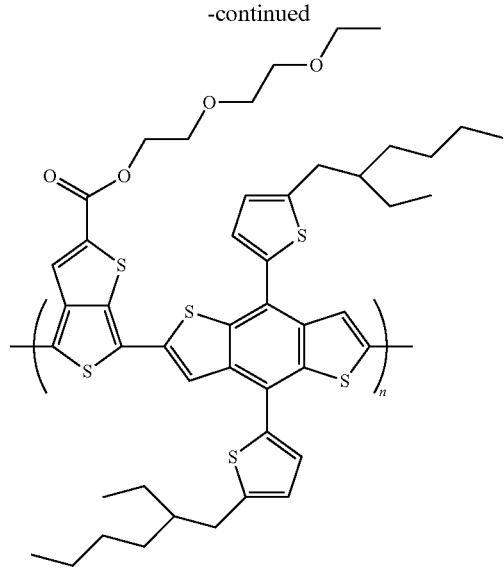
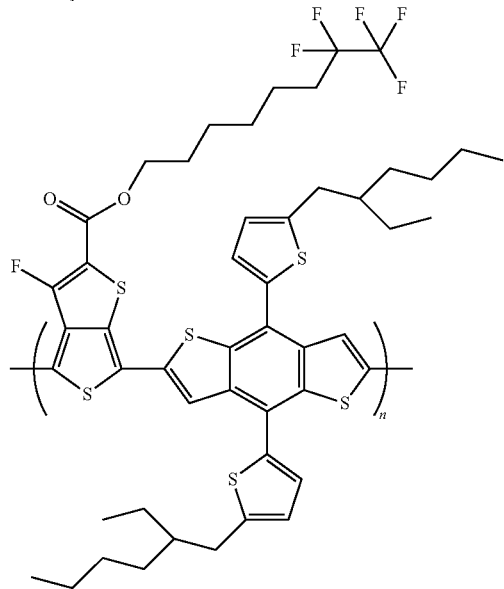
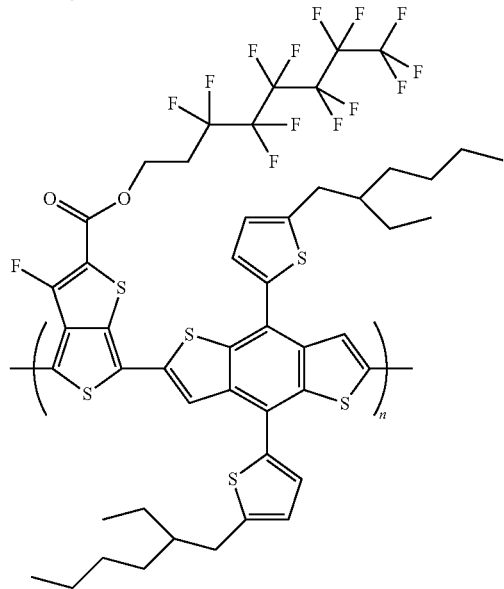
-continued
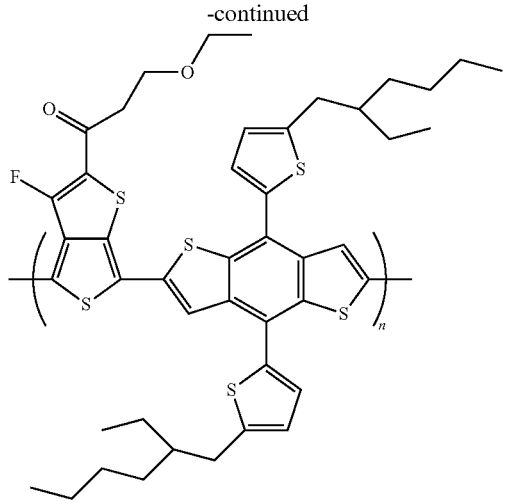
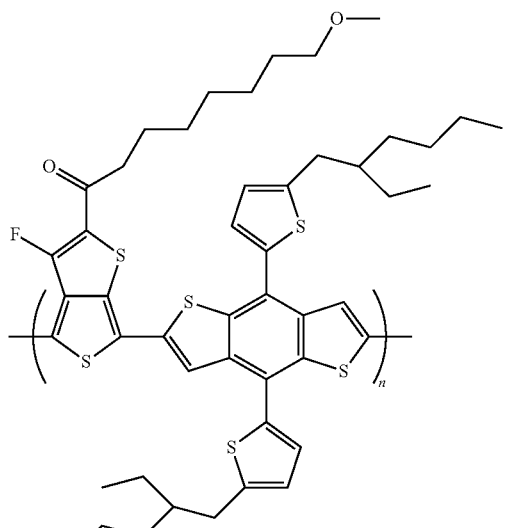
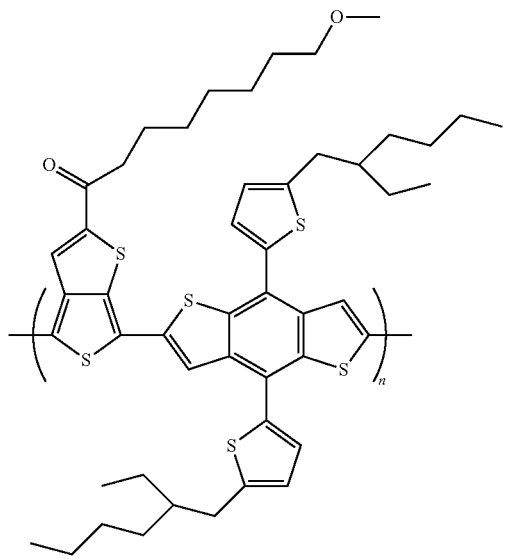

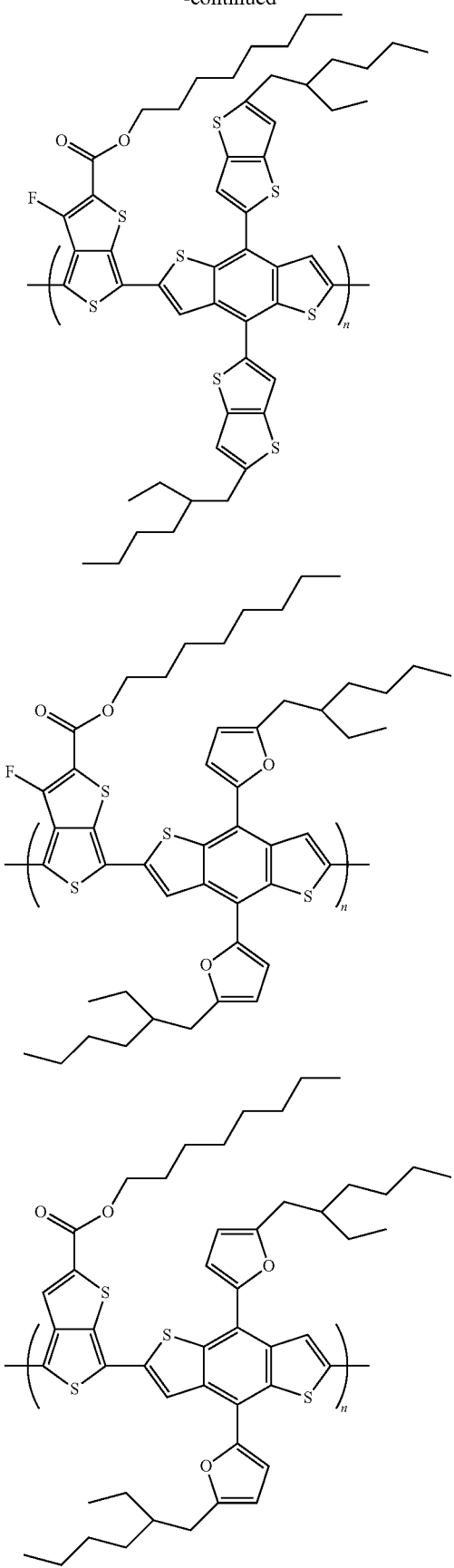
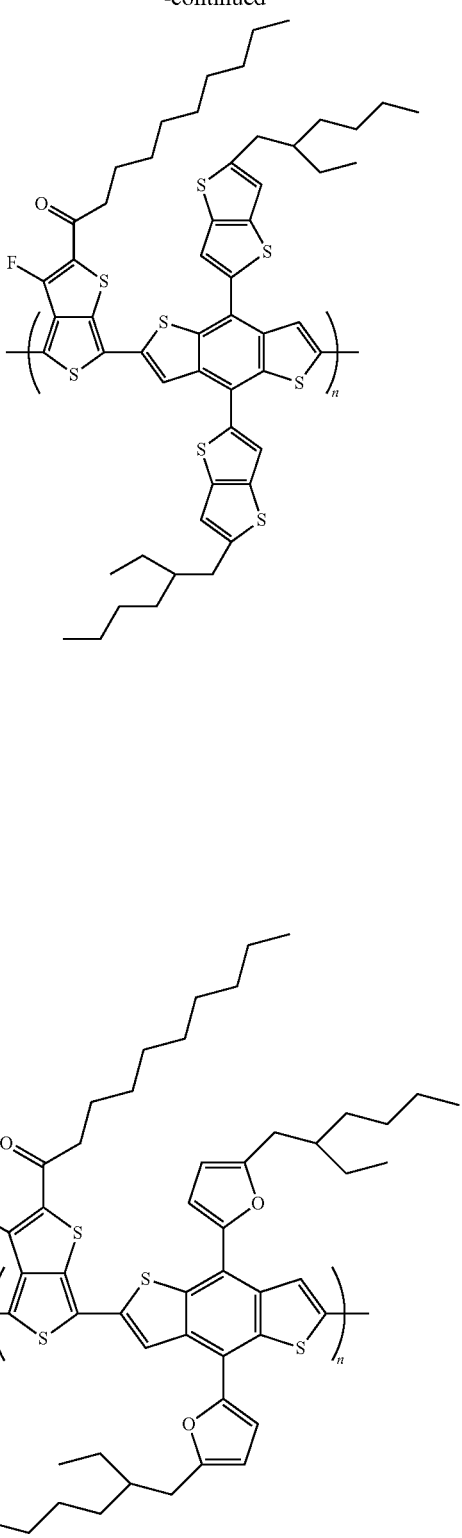

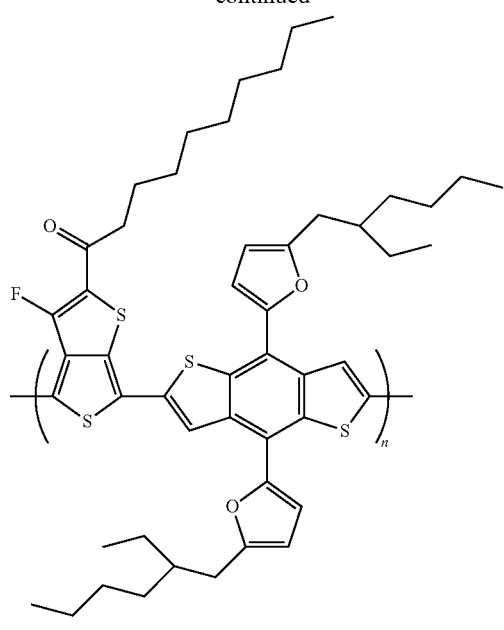

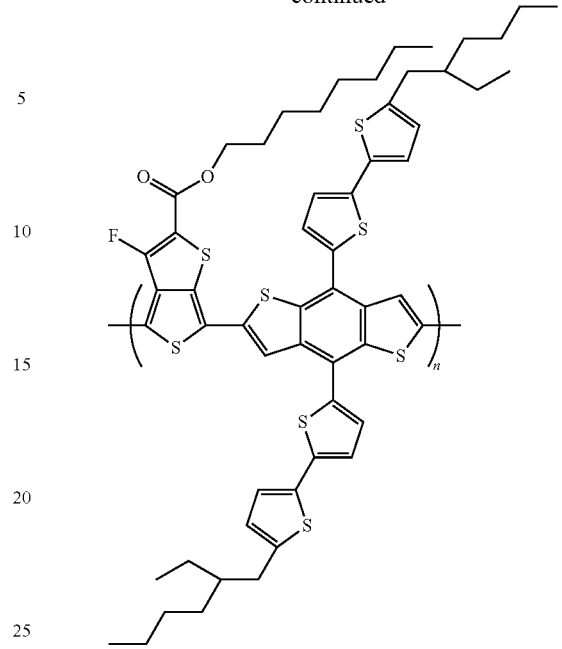

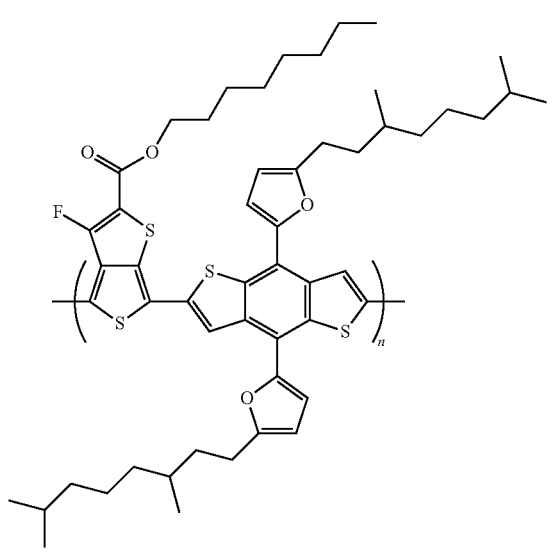

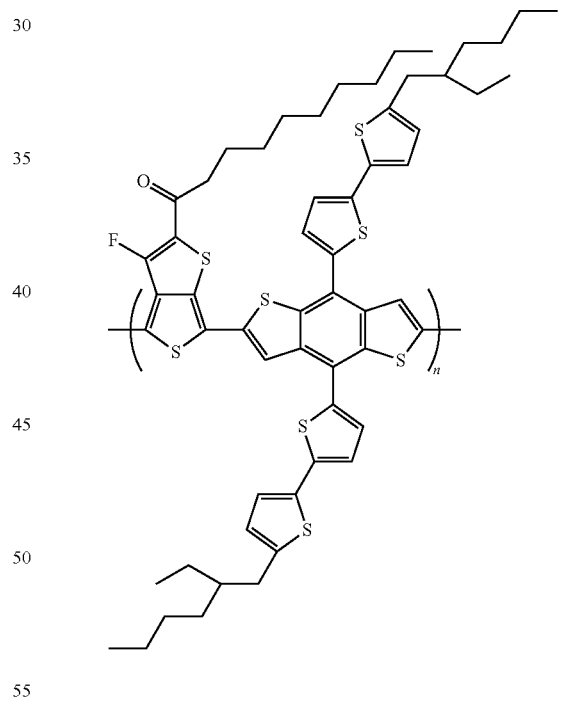

Moreover, in the conjugated polymer having a structure represented by formula (1), the structure represented by formula (1) may be a combination of structures in which $R^1$s, $R^2$s and Xs are different as long as the structures respectively satisfy a structure represented by formula (1). Examples thereof include the following structures. A numeral subscript of a repeating unit in parentheses represents a ratio of the repeating unit. n represents an integer of 2 or more and 1000 or less.

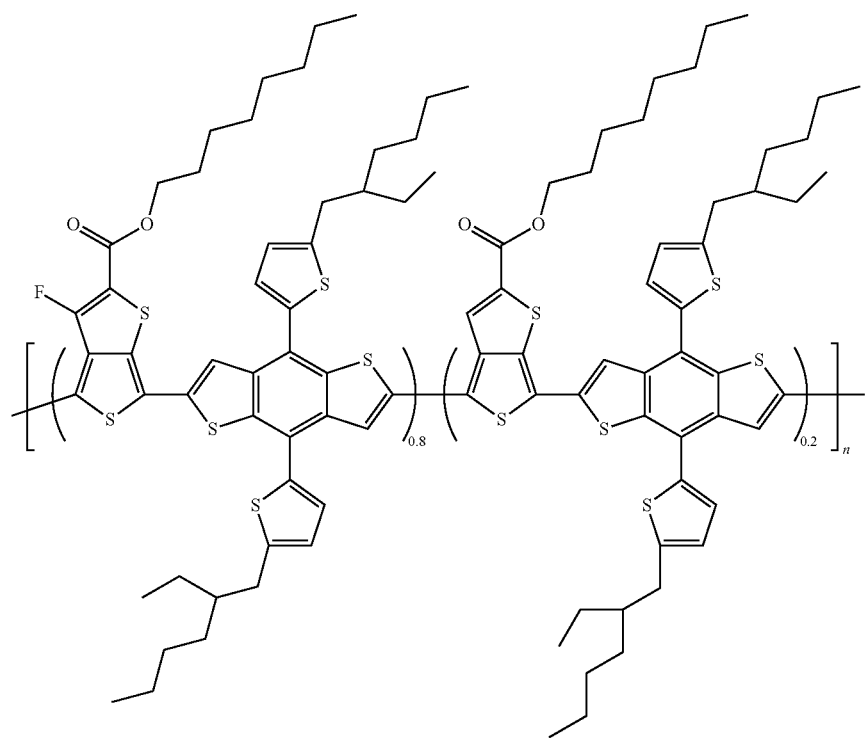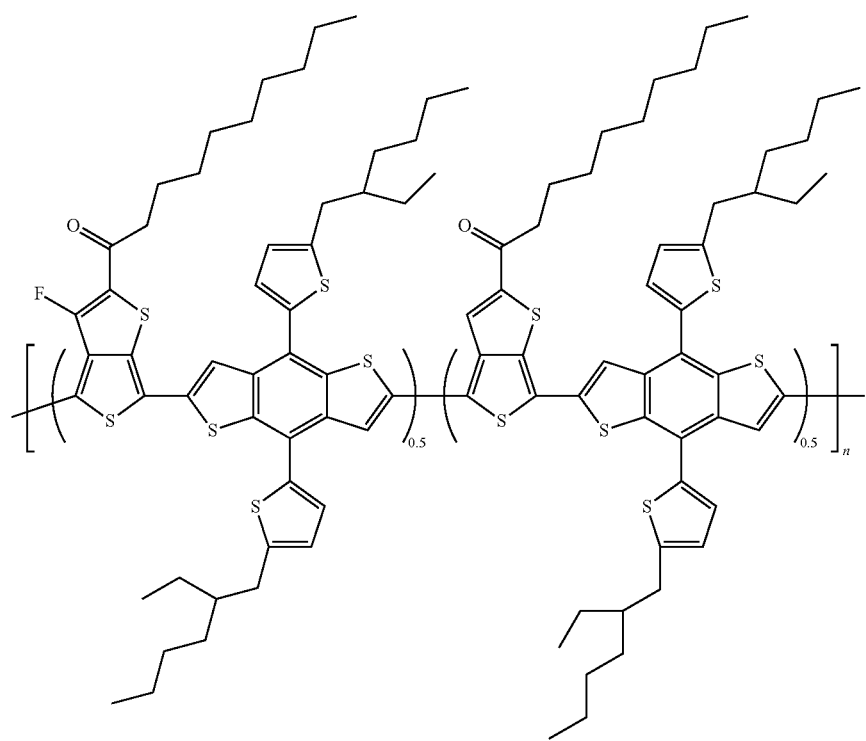

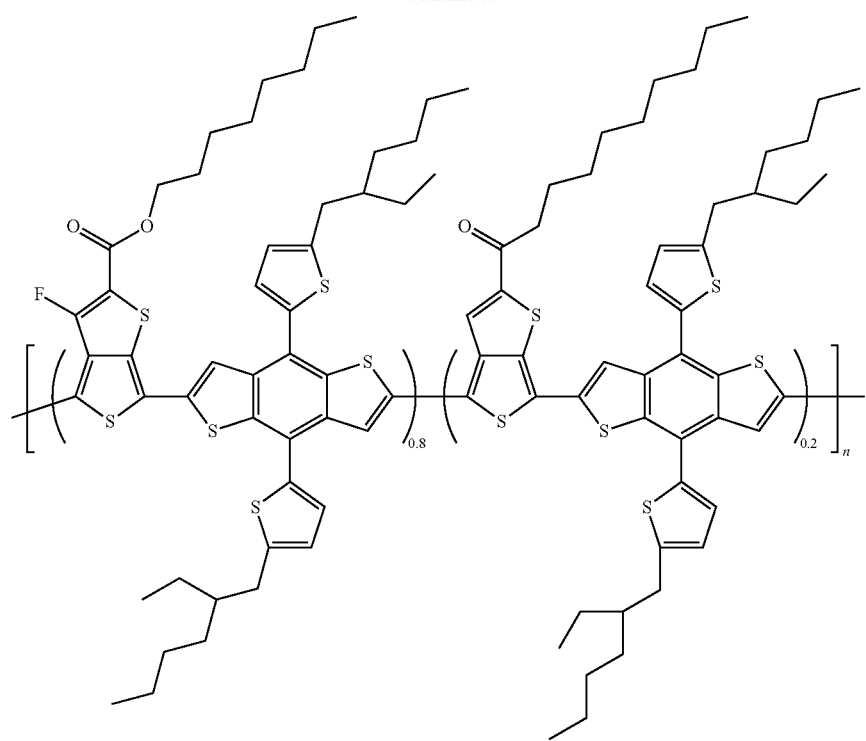
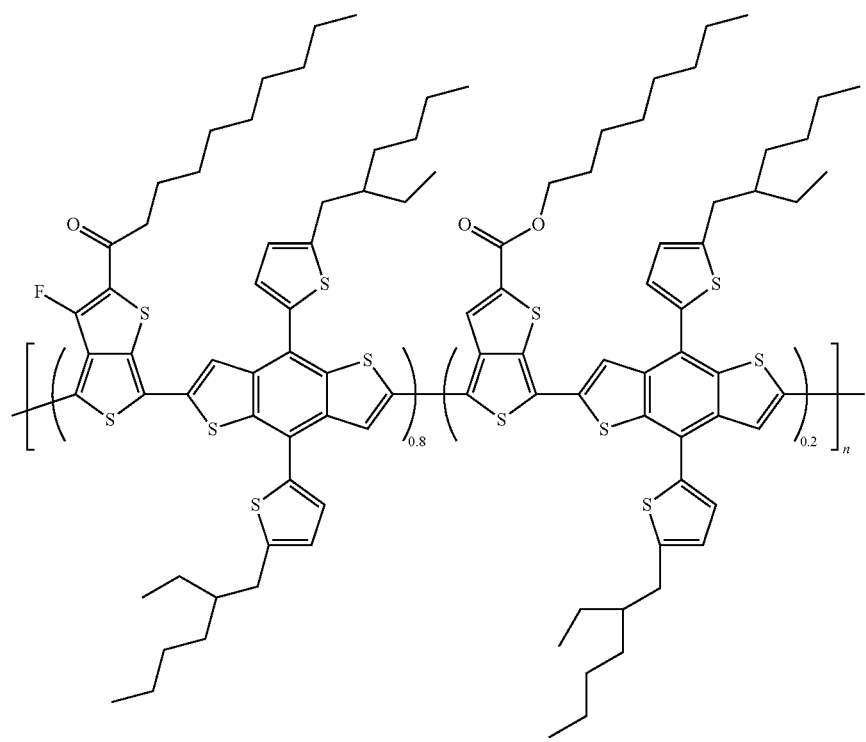

Moreover, the conjugated polymer having a structure represented by formula (1) may be a copolymer further containing a divalent conjugated linking group. The amount of the divalent conjugated linking group is preferably 20% by weight or less with respect to the entire conjugated polymer for maintaining the carrier mobility of the conjugated polymer. The amount of the divalent conjugated linking group is more preferably 10% by weight or less.

Examples of a preferred divalent conjugated linking group include the following structure. Among these, a structure composed of the thieno[3,4-b]thiophene skeleton and the benzo[1,2-b:4,5-b']dithiophene skeleton is preferred for maintaining the carrier mobility of the conjugated polymer.

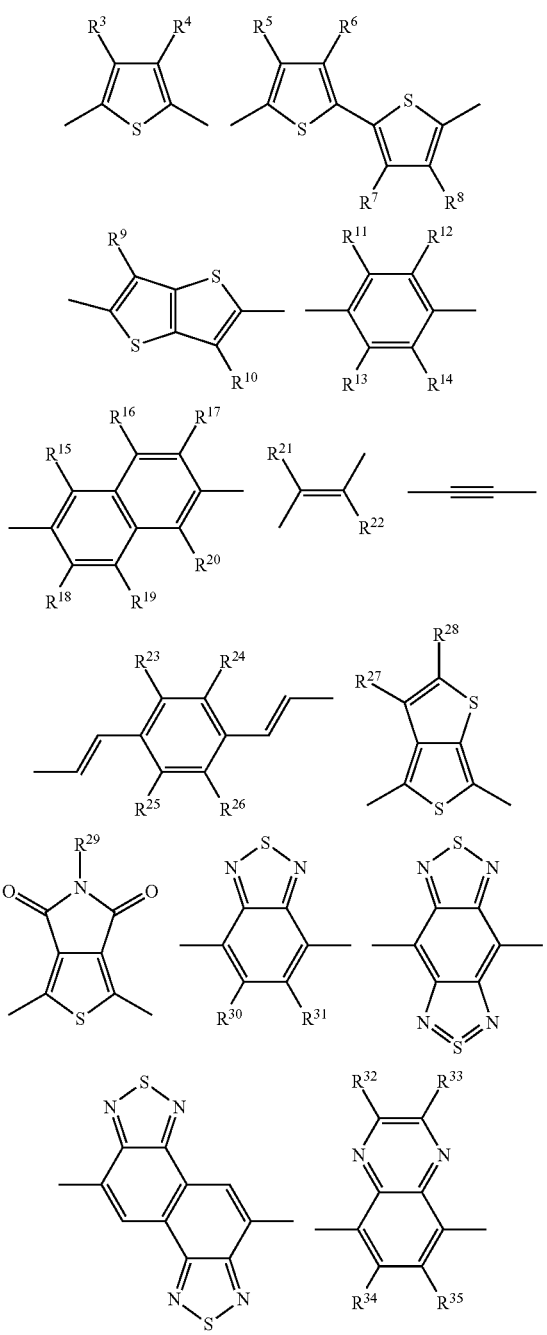

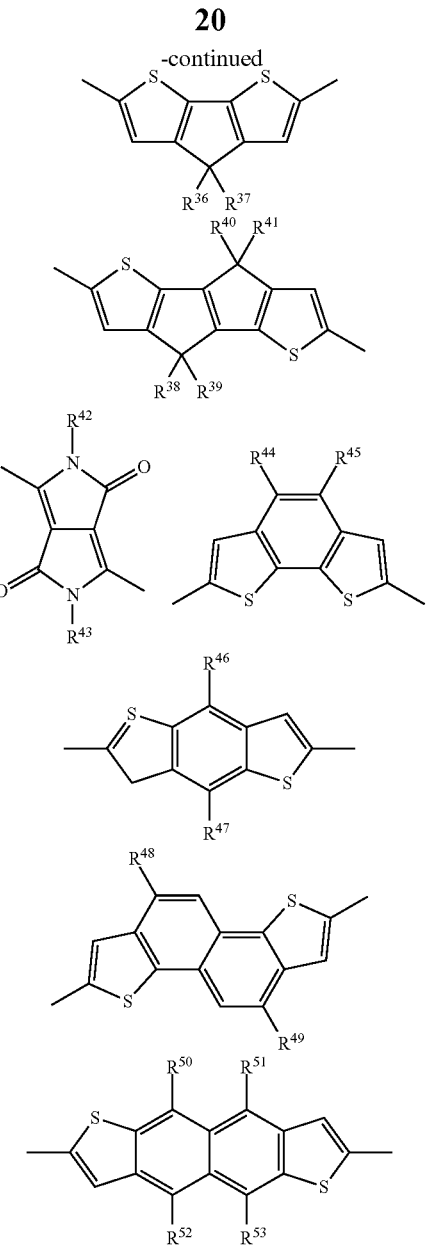

Each of $R^3$ to $R^{53}$ which may be the same or different is selected from among hydrogen, an alkyl group, an alkoxy group, an alkoxycarbonyl group, an alkylthioester group, an alkanoyl group, an aryl group, a heteroaryl group, and halogen.

In addition, the conjugated polymer having a structure represented by formula (1) can be synthesized, for example, by a method similar that described in WO 2011/011545 A described above, or a method similar that described in Y. Liang, D. Feng, Y. Wu, S.-T. Tsai, G. Li, C. Ray, L. Yu, "Journal of the American Chemical Society", Vol. 131, p. 7792, 2009, or F. He, W. Wang, W. Chen, T. Xu, S. B. Darling, J. Strzalka, Y. Liu, L. Yu, "Journal of the American Chemical Society", Vol. 133, p. 3284, 2011.

The material for a photovoltaic device may be composed of only the electron donating organic material using the conjugated polymer having a structure represented by formula (1), or may contain another electron donating organic material. Examples of other electron donating organic materials include conjugated polymers, such as a polythiophene polymer, benzothiadiazole-thiophene derivatives, a benzothiadiazole-thiophene copolymer, a poly(p-phenylenevinylene) polymer, a poly(p-phenylene)polymer, a polyfluorene polymer, a polypyrrole polymer, a polyaniline polymer, a polyacetylene polymer, and a poly(thienylene vinylene)polymer; and low-molecular weight organic compounds including phthalocyanine derivatives, such as $H_2$ phthalocyanine ($H_2$Pc), copper phthalocyanine (CuPc) and zinc phthalocyanine (ZnPc); porphyrin derivatives; triaryl amine derivatives, such as N,N'-diphenyl-N,N'-di(3-methylphenyl)-4,4'-diphenyl-1,1'-diamine (TPD) and N,N'-dinaphtyl-N,N'-diphenyl-4,4'-diphenyl-1,1'-diamine (NPD); carbazole derivatives, such as 4,4'-di(carbazole-9-yl)biphenyl (CBP); and oligothiophene derivatives (terthiophene, quaterthiophene, sexithiophene, octithiophene and the like).

The conjugated polymer having a structure represented by formula (1) is an electron donating organic material exhibiting p-type organic semiconductor characteristics, and in the material for a photovoltaic device, the electron donating organic material is preferably combined with the electron accepting organic material (n-type organic semiconductor) in order to obtain higher photoelectric conversion efficiency.

Examples of the electron accepting organic material which exhibits an n-type semiconductor characteristic include: oxazole derivatives such as 1,4,5,8-naphthalene tetracarboxylic dianhydride (NTCDA), 3,4,9,10-perylenetetracarboxylic dianhydride (PTCDA), 3,4,9,10-perylenetetracarboxylic bisbenzimidazole (PTCBI), N,N'-dioctyl-3,4,9,10-naphthyltetracarboxy diimide (PTCDI-C8H), 2-(4-biphenylyl)-5-(4-t-butylphenyl)-1,3,4-oxadiazole (PBD), and 2,5-di(1-naphthyl)-1,3,4-oxadiazole (BND); triazole derivatives such as 3-(4-biphenylyl)-4-phenyl-5-(4-t-butylphenyl)-1,2,4-triazole (TAZ); phenanthroline derivatives, phosphine oxide derivatives, fullerene compounds (unsubstituted compounds including $C_{60}$, $C_{70}$, $C_{76}$, $C_{78}$, $C_{82}$, $C_{84}$, $C_{90}$ and $C_{94}$, [6,6]-phenyl C61 butyric acid methylester ([6,6]-PCBM), [5,6]-phenyl C61 butyric acid methylester ([5,6]-PCBM), [6,6]-phenyl C61 butyric acid hexylester ([6,6]-PCBH), [6,6]-phenyl C61 butyric acid dodecylester ([6,6]-PCBD), phenyl C71 butyric acid methylester ($PC_{70}BM$), and phenyl C85 butyric acid methylester ($PC_{84}BM$)), carbon nanotubes (CNT), and a derivative prepared by introducing a cyano group to a poly-p-phenylenevinylene polymer (CN-PPV). Among these, the fullerene compound is preferably used since it has high charge separating rate and electron transfer rate. Among the fullerene compounds, the $C_{70}$ derivative (the above-mentioned $PC_{70}BM$ or the like) is more preferably used since it is excellent in a light absorbing characteristic, and provides a higher photoelectric conversion efficiency.

In the material for a photovoltaic device, in which the electron donating organic material using the conjugated polymer having a structure represented by formula (1) is combined with the electron accepting organic material, the content ratio (weight percentage) between the electron donating organic material and the electron accepting organic material is not particularly limited; however, the content ratio between the electron donating organic material and the electron accepting organic material (ratio between a donor and an acceptor) is preferably 1:99 to 99:1, more preferably 10:90 to 90:10, and moreover preferably 20:80 to 60:40.

The electron donating organic material and the electron accepting organic material may be mixed for use, or may be stacked for use. A method of mixing the materials is not particularly limited, and examples thereof include a method in which these materials are added to a solvent at a desired ratio, and then dissolved in the solvent by one or a combination of plural process such as heating, stirring and irradiation with ultrasonic waves. In addition, when the material for a photovoltaic device forms a single organic semiconductor layer, as described later, the above-mentioned content ratio refers to a content ratio between the electron donating organic material and the electron accepting organic material contained in the single layer, and when the organic semiconductor layer has a stacked structure having two or more layers, the above-mentioned content ratio refers to a content ratio between the electron donating organic material and the electron accepting organic material in the entire organic semiconductor layers.

To further improve the photoelectric conversion efficiency, it is preferred to eliminate, as far as possible, impurities which might cause a trap of carriers. A method of removing impurities in the electron donating organic material using the conjugated polymer having a structure represented by formula (1) or the electron accepting organic material is not particularly limited, and the following methods may be used: a column chromatography method, a re-crystallizing method, a sublimation method, a re-precipitation method, a Soxhlet extraction method, a molecular weight fractionation method by using GPC, a filtration method, an ion exchange method, a chelate method, and the like. In general, a column chromatography method, a re-crystallizing method, or a sublimation method is preferably used for refining a low-molecular weight organic material. On the other hand, to refine a high-molecular weight organic material, a re-precipitation method, a Soxhlet extraction method, a molecular weight fractionation method by using GPC, or a filtration method is preferably used when a low-molecular weight component is eliminated, and a re-precipitation method, a chelate method, or an ion exchange method is preferably used when a metal component is eliminated. Among these methods, a plurality of methods may be combined.

Figure 2:
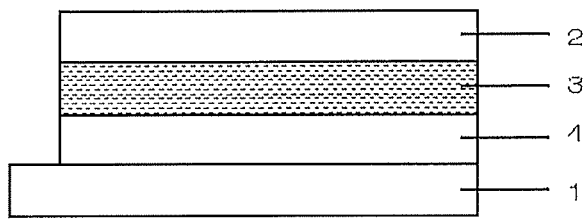
FIG. 2 is a schematic view showing another aspect of a photovoltaic device.

Next, the photovoltaic device will be described. The photovoltaic device has at least a positive electrode and a negative electrode, and contains the material for a photovoltaic device between the positive electrode and the negative electrode. FIG. 1 is a schematic view showing an example of a photovoltaic device. In FIG. 1, reference numeral 1 represents a substrate, reference numeral 2 represents the positive electrode, reference numeral 3 represents an organic semiconductor layer containing the material for a photovoltaic device, and reference numeral 4 represents the negative electrode. The photovoltaic device may be stacked in order of substrate 1/negative electrode 4/organic semiconductor layer 3/positive electrode 2, as shown in FIG. 2.

Figure 3:
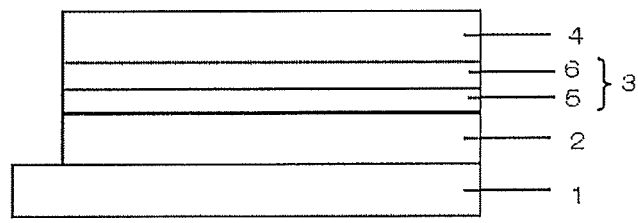
FIG. 3 is a schematic view showing another aspect of a photovoltaic device.
Figure 4:
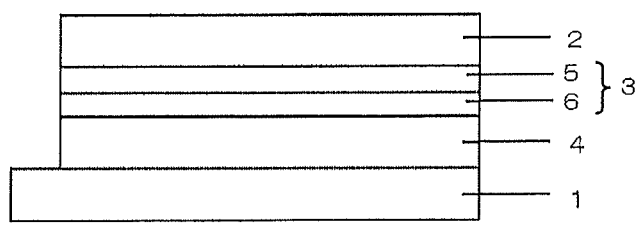
FIG. 4 is a schematic view showing another aspect of a photovoltaic device.

The organic semiconductor layer 3 contains the material for a photovoltaic device. That is, the organic semiconductor layer 3 contains the electron donating organic material using the conjugated polymer having a structure represented by formula (1) and the electron accepting organic material. When the organic semiconductor layer 3 serving as an organic power generating layer of the photovoltaic device contains the electron donating organic material and the electron accepting organic material, these materials may be mixed with each other, or formed as stacked layers. However, the mixed state is preferred. That is, the organic semiconductor layer containing the material for a photovoltaic device may be a layer in which the electron donating organic material and the electron accepting organic material are mixed, as shown in FIGS. 1 and 2, or the organic semiconductor layer containing the material for a photovoltaic device may have a stacked structure of a layer containing the electron donating organic material and a layer containing the electron accepting organic material, as shown in FIGS. 3 and 4. However, the organic semiconductor layer containing the material for a photovoltaic device is preferably a layer in which the electron donating organic material and the electron accepting organic material are mixed.

The photovoltaic device of the bulk hetero junction type is preferred, in which the area of the junction between the electron donating organic material and the electron accepting organic material, contributing to the photoelectric conversion, is increased by mixing the electron donating organic material and the electron accepting organic material. In the organic semiconductor layer 3 which is the organic power generating layer of the bulk hetero junction type, the electron donating organic material using the conjugated polymer having a structure represented by formula (1) and the electron accepting organic material are phase-separated from each other in a level of a nanometer. A size of a domain of the phase-separation structure is not particularly limited. However, it is usually 1 nm or more and 50 nm or less.

Further, when the electron donating organic material using the conjugated polymer having a structure represented by formula (1) is stacked on the electron accepting organic material, it is preferred that the layer containing the electron donating organic material exhibiting a p-type semiconductor characteristic is placed on the positive electrode side, and the layer containing the electron accepting organic material exhibiting an n-type semiconductor characteristic is placed on the negative electrode side. FIGS. 3 and 4 illustrate one example of the photovoltaic device when the organic semiconductor layer 3 is stacked in this way. Reference numeral 5 represents a layer having the electron donating organic material using the conjugated polymer having a structure represented by formula (1), and reference numeral 6 represents a layer having the electron accepting organic material. The organic semiconductor layer preferably has a thickness of 5 nm to 500 nm, and more preferably a thickness of 30 nm to 300 nm. The layer having the electron donating organic material preferably has a thickness of 1 nm to 400 nm of the thickness of the organic semiconductor layer, more preferably a thickness of 15 nm to 150 nm.

In the photovoltaic device, either the positive electrode 2 or the negative electrode 4 preferably has a light-transmitting property. The light-transmitting property of the electrode is not particularly limited as long as it allows incident light to reach the organic semiconductor layer 3 so that an electromotive force is generated. Herein, the light-transmitting property is a value obtained by the following expression:

[Transmitted light intensity $(W/m^2)$/Incident light intensity $(W/m^2)$]×100(%).

The thickness of the electrode is only necessary to be in such a range that provides a light-transmitting property and conductivity, and although different depending on the electrode materials, it is preferably 20 nm to 300 nm. In addition, a light-transmitting property is not necessarily required of the other electrode as long as the conductivity is provided, and the thickness of the other electrode is also not particularly limited.

Examples of a material preferably used as an electrode material include metals such as gold, platinum, silver, copper, iron, zinc, tin, aluminum, indium, chromium, nickel, cobalt, scandium, vanadium, yttrium, indium, cerium, samarium, europium, terbium, and ytterbium; oxides of metals such as indium, tin, molybdenum and nickel; composite metal oxides (indium tin oxide (ITO), indium zinc oxide (IZO), aluminum zinc oxide (AZO), gallium zinc oxide (GZO) and the like); alkali metals and alkaline-earth metals, specifically, lithium, magnesium, sodium, potassium, calcium, strontium and barium. Moreover, electrodes composed of alloys made from the above-mentioned metals or laminates of the above-mentioned metals are also preferably used. An electrode containing graphite, a graphite intercalation compound, a carbon nanotube, graphene, polyaniline or its derivatives, or polythiophene or its derivatives is also preferably used. In this case, it is preferred that at least one of the positive electrode and the negative electrode is transparent or translucent. The above-mentioned electrode material may form a mixed layer or a stacked structure, which are respectively made from two or more materials.

The conductive material to be used for the positive electrode 2 is preferably a compound to be ohmic-joined to the organic semiconductor layer 3. Moreover, when a hole transporting layer described later is used, the conductive material to be used for the positive electrode 2 is preferably a compound to be ohmic jointed to the hole transporting layer. The conductive material to be used for the negative electrode 4 is preferably a compound to be ohmic-joined to the organic semiconductor layer 3 or an electron transporting layer. Examples of a method of improving joining include a method in which metal fluoride such as lithium fluoride (LiF) and cesium fluoride is introduced into the negative electrode as an electron extraction layer. Introduction of the electron extraction layer allows an extraction current to improve.

Depending on the kinds and usages of the photoelectric conversion material, the substrate 1 may be formed as a substrate on which an electrode material and an organic semiconductor layer can be stacked, for example, as a film or a plate prepared by using any method from an inorganic material such as non-alkali glass, quartz glass, aluminum, iron, copper or an alloy such as stainless steel, or an organic material such as polyester, polycarbonate, polyolefin, polyamide, polyimide, polyphenylene sulfide, polyparaxylene-polymethyl methacrylate, an epoxy resin, or a fluorine-based resin. Further, when incident light from the substrate side is used, it is preferred that each of the above-mentioned substrates preferably has a light-transmitting property of 80% or more.

The hole transporting layer may be disposed between the positive electrode 2 and the organic semiconductor layer 3. Examples of a material to form the hole transporting layer preferably include conductive polymers such as a polythiophene-based polymer, a poly-p-phenylenevinylene-based polymer, a polyfluorene-based polymer, a polypyrrole polymer, a polyaniline polymer, a polyfuran polymer, a polypyridine polymer, and a polycarbazole polymer; low-molecular weight organic compounds exhibiting p-type semiconductor characteristics such as phthalocyanine derivatives ($H_2Pc$, CuPc, ZnPc and the like), porphyrin derivatives, and acene-based compounds (tetracene, pentacene and the like); carbon compounds such as graphene and graphene oxide; and inorganic compounds including molybdenum oxide ($MoO_x$) such as $MoO_3$, tungsten oxide ($WO_x$) such as $WO_3$, nickel oxide ($NiO_x$) such as NiO, vanadium oxide ($VO_x$) such as $V_2O_5$, zirconium oxide ($ZrO_x$) such as $ZrO_2$, copper oxide ($CuO_x$) such as $Cu_2O$, copper iodide, ruthenium oxide ($RuO_x$) such as $RuO_4$, and ruthenium oxide ($ReO_x$) such as $Re_2O_7$. Particularly, polyethylene dioxythiophene (PEDOT) serving as a polythiophene-based polymer, those materials prepared by adding polystyrene sulfonate (PSS) to PEDOT, molybdenum oxide, vanadium oxide and tungsten oxide, are preferably used. The hole transporting layer may be a layer made of a single compound, or may be a mixed layer or a stacked structure, which are respectively made of two or more compounds. Moreover, the hole transporting layer preferably has a thickness of 5 to 600 nm, more preferably a thickness of 10 to 200 nm.

Moreover, in the photovoltaic device, the electron transporting layer may be disposed between the organic semiconductor layer 3 and the negative electrode 4. The material used to form the electron transporting layer is not particularly limited, and examples of the material preferably used include organic materials exhibiting n-type semiconductor characteristics such as the above-mentioned electron accepting organic materials (NTCDA, PTCDA, PTCDI-C8H, oxazole derivatives, triazole derivatives, phenanthroline derivatives, phosphine oxide derivatives, phosphine sulfide derivatives, quinoline derivatives, fullerene compounds, CNT, CN-PPV and the like). Further, ionic compounds, such as an ionic substituted fluorene polymer ("Advanced Materials", Vol. 23, pp. 4636-4643, 2011, "Organic Electronics", Vol. 10, pp. 496-500, 2009) and a combination of the ionic substituted fluorene polymer and a substituted thiophene polymer ("Journal of American Chemical Society", Vol. 133, pp. 8416-8419, 2011), polyethylene oxide ("Advanced Materials", Vol. 19, pp. 1835-1838, 2007) and the like can also be used as the electron transporting layer.

Moreover, compounds having ionic groups such as ammonium salt, amine salt, pyridinium salt, imidazolium salt, phosphonium salt, carboxylate salt, sulfonate salt, phosphate salt, sulfuric acid ester salt, phosphoric acid ester salt, sulfate salt, nitrate salt, acetonate salt, oxo acid salt and a metal complex, can also be used as the electron transporting layer. Specific examples thereof include ammonium chloride, ammonium acetate, ammonium phosphate, hexyltrimethylammonium bromide, tetrabutylammonium bromide, octadecyltrimethylammonium bromide, hexadecylpyridinium bromide, 1-butyl-3-methylimidazolium bromide, tributylhexadecylphosphonium bromide, zinc formate, zinc acetate, zinc propionate, zinc butyrate, zinc oxalate, sodium heptadecafluorononanate, sodium myristate, sodium benzoate, sodium 1-hexadecanesulfonate, sodium dodecyl sulfate, sodium monododecyl phosphate, zinc acetylacetonate, ammonium chromate, ammonium metavanadate, ammonium molybdate, ammonium hexafluorozirconate, sodium tungstate, ammonium tetrachlorozincate, tetraisopropyl orthotitanate, lithium nickelate, potassium permanganate, silver phenanthroline complex, AgTCNQ, and compounds used for the electron transporting layer, which is described in Japanese Patent Laid-open Publication No. 2013-58714.

Also, inorganic materials, for example, metal oxides including titanium oxide ($TiO_x$) such as $TiO_2$, zinc oxide ($ZnO_x$) such as ZnO, silicon oxide ($SiO_x$) such as $SiO_2$, tin oxide ($SnO_x$) such as $SnO_2$, tungsten oxide ($WO_x$) such as $WO_3$, tantalum oxide ($TaO_x$) such as $Ta_2O_3$, barium titanate ($BaTi_xO_y$) such as $BaTiO_3$, barium zirconate ($BaZr_xO_y$) such as $BaZrO_3$, zirconium oxide ($ZrO_x$) such as $ZrO_2$, hafnium oxide ($HfO_x$) such as $HfO_2$, aluminum oxide ($AlO_x$) such as $Al_2O_3$, yttrium oxide ($YO_x$) such as $Y_2O_3$ and zirconium silicate ($ZrSi_xO_y$) such as $ZrSiO_4$; nitrides including silicon nitride ($SiN_x$) such as $Si_3N_4$; and semiconductors including cadmium sulfide ($CdS_x$) such as CdS, zinc selenide ($ZnSe_x$) such as ZnSe, zinc sulfide ($ZnS_x$) such as ZnS, and cadmium telluride ($CdTe_x$) such as CdTe, are preferably used as the electron transporting layer.

Examples of a method of forming the electron transporting layer by using the above-mentioned inorganic material include a method in which a solution of a precursor of metal salt or metal alkoxide of the inorganic material is applied and then heated to form a layer, and a method of forming a layer by applying a dispersion of nanoparticles onto a substrate. Depending on a heating temperature and time and a synthesis condition of nanoparticles, a reaction does not have to proceed completely, and the precursor may be partially hydrolyzed or partially condensed to become an intermediate product or become a mixture of the precursor, the intermediate product and a final product.

The phenanthroline derivative is not particularly limited, and examples thereof include phenanthroline monomer compounds such as bathocuproine (BCP), bathophenanthroline (Bphen), 2-(naphthalen-2-yl)-4,7-diphenyl-1,10-phenanthroline (HNBphen), and 2,9-bis(naphthalen-2-yl)-4,7-diphenyl-1,10-phenanthroline (NBphen); and phenanthroline oligomer compounds described in Japanese Patent Laid-open Publication No. 2012-39097. The phenanthroline dimer compound is as described in Japanese Patent Laid-open Publication No. 2012-39097, and is compounds represented by formula (2).

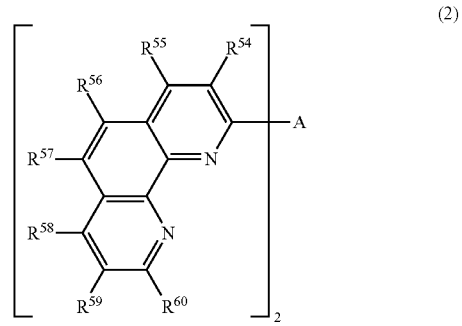

(2)

Each of $R^{54}$ to $R^{60}$ which may be the same or different is selected from among hydrogen, an alkyl group, and an aryl group. A represents a divalent aromatic hydrocarbon group. Two substituents having a phenanthroline skeleton may be the same or different. The alkyl group indicates saturated aliphatic hydrocarbon groups such as a methyl group, an ethyl group, a propyl group, and a butyl group, and the aryl group indicates aromatic hydrocarbon groups such as a phenyl group, a tolyl group, a biphenyl group, a naphthyl group, a phenanthryl group, and an anthryl group, and these groups may be unsubstituted, or may be substituted. The number of carbon atoms of the alkyl group or aryl group is preferably about 1 to 20. Two groups having a phenanthroline skeleton may be the same or different.

The above-mentioned phosphine oxide derivative is not particularly limited, and examples thereof include phosphine compounds such as phenyl-dipyrenylphosphine oxide ($POPy_2$).

The above-mentioned quinoline derivative is not particularly limited, and examples thereof include compounds such as lithium 8-hydroxyquinolate (Liq) and aluminum tris(8-hydroxyquinolate).

A mechanism in which the characteristic is improved by these electron transporting layers is not apparent. However, it is considered that the electron extraction efficiency and charge generation efficiency are improved by the actions that the electron transporting layer reduces energy barrier in a joint interface to the negative electrode, and that the electron transporting layer prevents deactivation of excitons generated in the electron donating organic semiconductor and the electron accepting organic semiconductor at the interface with the negative electrode.

Among the above-mentioned electron transporting layers, the phenanthroline derivative is preferably used since it has an electron transporting property and facilitates obtaining a uniform film. Moreover, the phenanthroline oligomer compound is preferably used since it facilitates obtaining a stable film having a high glass transition point, and the phenanthroline dimer compound is furthermore preferably used in consideration of ease of synthesis. Among the phenanthroline dimer compounds, a phenanthroline dimer compound in which A in formula (2) is a substituted or unsubstituted phenylene group or a substituted or unsubstituted naphthylene group is preferably used because of a balance between a sublimating property at the time of forming a thin film such as the time of vacuum vapor deposition and an ability to form a thin-film.

The electron transporting layer preferably has a thickness of 0.1 to 600 nm, more preferably a thickness of 1 to 200 nm, and moreover preferably a thickness of 1 to 20 nm. The electron transporting layer may be a layer made of a single compound, or may be a layer made of two or more compounds. Moreover, the electron transporting layer may be a mixed layer of an alkali metal or an alkaline-earth metal, specifically lithium, magnesium, calcium, or compounds including metal fluoride such as lithium fluoride and cesium fluoride, and the above-mentioned material for the electron transporting layer, or may be a stacked structure thereof.

Moreover, in the photovoltaic device, two or more organic semiconductor layers may be stacked with one or more intermediate electrodes interposed there between to form series junctions. Such a constitution is sometimes referred to as a tandem structure. For example, the tandem structure includes: substrate/positive electrode/first organic semiconductor layer/intermediate electrode/second organic semiconductor layer/negative electrode. Another tandem structure includes: substrate/negative electrode/first organic semiconductor layer/intermediate electrode/second organic semiconductor layer/positive electrode. By using this tandem structure, it becomes possible to improve an open circuit voltage. In addition, the above-mentioned hole transporting layer may be disposed between the positive electrode and the first organic semiconductor layer, and between the intermediate electrode and the second organic semiconductor layer, and the hole transporting layer may be disposed between the first organic semiconductor layer and the intermediate electrode, and between the second organic semiconductor layer and the negative electrode.

When such a tandem structure is employed, it is preferred that at least one layer of organic semiconductor layers contains the material for a photovoltaic device and another layer contains an electron donating organic material different in a band gap from the electron donating organic material using the conjugated polymer having a structure represented by formula (1) to avoid a reduction of the short-circuit current. Examples of such an electron donating organic materials include conjugated polymers such as a polythiophene polymer, a poly(p-phenylenevinylene)polymer, a poly(p-phenylene)polymer, a polyfluorene polymer, a polypyrrole polymer, a polyaniline polymer, a polyacetylene polymer, a poly(thienylene vinylene)polymer, and a benzothiadiazole polymer (e.g., PCPDTBT (poly[2,6-(4,4-bis-(2-ethylhexyl)-4H-cyclopenta[2,1-b; 3,4-b']dithiophene)-alt-4,7-(2,1,3-benzothiadiazole)]), and PSBTBT (poly[(4,4-bis-(2-ethylhexyl)dithieno[3,2-b:2',3'-d]silole)-2,6-diyl-alt-(2,1,3-benzothiadiazole)-4,7-diyl])); and the low-molecular weight organic compounds including phthalocyanine derivatives such as $H_2$ phthalocyanine ($H_2$Pc), copper phthalocyanine (CuPc) and zinc phthalocyanine (ZnPc); porphyrin derivatives; triaryl amine derivatives such as N,N'-diphenyl-N,N'-di(3-methylphenyl)-4,4'-diphenyl-1,1'-diamine (TPD) and N,N'-dinaphtyl-N,N'-diphenyl-4,4'-diphenyl-1,1'-diamine (NPD); carbazole derivatives such as 4,4'-di(carbazole-9-yl) biphenyl (CBP); and oligothiophene derivatives (terthiophene, quaterthiophene, sexithiophene, octithiophene and the like).

Moreover, as a material for the intermediate electrode to be used herein, those having high conductivity are preferably used, and examples thereof include the above-mentioned metals such as gold, platinum, chromium, nickel, lithium, magnesium, calcium, tin, silver and aluminum; oxides of metals such as indium, tin and molybdenum having transparency; and composite metal oxides (indium tin oxide (ITO) and indium zinc oxide (IZO) and the like); alloys made from the above-mentioned metals and laminates of the above-mentioned metals; and polyethylene dioxythiophene (PEDOT) and PEDOT to which polystyrene sulfonate (PSS) is added. The intermediate electrode preferably has a light-transmitting property, and even in the case of a material such as metal having a low light-transmitting property, by making the film thickness thinner, a sufficient light-transmitting property can be ensured in many cases.

Next, a method of producing a photovoltaic device will be described by way of examples. A transparent electrode (in this case, corresponding to a positive electrode) such as ITO is formed on a substrate by a sputtering method or the like. A material for a photovoltaic device, which contains an electron donating organic material using the conjugated polymer having a structure represented by formula (1), and an electron accepting organic material as required, is dissolved in a solvent to prepare a solution, and the solution is applied onto the transparent electrode to form an organic semiconductor layer.

The solvent to be used in this time is not particularly limited as long as it allows the organic semiconductor to be appropriately dissolved or dispersed in a solvent. However, an organic solvent is preferred, and examples of the organic solvent include aliphatic hydrocarbons such as hexane, heptane, octane, isooctane, nonane, decane, cyclohexane, decalin and bicyclohexyl; alcohols such as methanol, ethanol, butanol, propanol, ethylene glycol and glycerin; ketones such as acetone, methyl ethyl ketone, cyclopentanone, cyclohexanone and isophorone; esters such as ethyl acetate, butyl acetate, methyl lactate, γ-butyrolactone, diethylene glycol monobutyl ether acetate and dimethyl carbonate; ethers such as ethyl ether, methyl tert-butyl ether, tetrahydrofuran, 1,4-dioxane, tetrahydropyran, 3,4-dihydro-2H-pyran, isochroman, ethylene glycol monomethyl ether and diglyme; amines such as ammonia and ethanol amine; amides such as N,N-dimethylformamide, dimethylacetamide and N-methyl-2-pyrrolidone; sulfones such as sulfolane; sulfoxides such as dimethyl sulfoxide; carbon disulfide; thiols such as 1,8-octanedithiol; nitriles such as acetonitrile and acrylonitrile; fatty acids such as acetic acid and lactic acid; heterocyclic compounds such as furan, thiophene, pyrrole and pyridine; aromatic hydrocarbons such as benzene, toluene, xylene, ethylbenzene, cumene, n-butylbenzene, sec-butylbenzene, tert-butylbenzene, styrene, mesitylene, 1,2,4-trimethylbenzene, p-cymene, cyclohexylbenzene, diethylbenzene, pentylbenzene, dipentylbenzene, dodecylbenzene, ethynylbenzene, tetralin, anisole, phenetol, butyl phenyl ether, pentyl phenyl ether, veratrole, 1,3-dimethoxybenzene, 1,2,4-trimethoxybenzene, 3,4,5-trimethoxytoluene, 2-methoxytoluene, 2,5-dimethylanisole, o-chlorophenol, chlorobenzene, dichlorobenzene, trichlorobenzene, 1-chloronaphthalene, 1-bromonaphthalene, 1-methylnaphthalene, o-diiodobenzene, acetophenone, 2,3-benzofuran, 2,3-dihydrobenzofuran, 1,4-benzodioxane, phenyl acetate, methyl benzoate, cresol, aniline and nitrobenzene; and halogen hydrocarbons such as dichloromethane, 1,2-dichloroethylene, trichloroethylene, tetrachloroethylene, chloroform, carbon tetrachloride, dichloroethane, trichloroethane, 1,3-dichloropropane, 1,1,1,2-tetrachloroethane, 1,1,1,3-tetrachloropropane, 1,2,2,3-tetrachloropropane, 1,1,2,3-tetrachloropropane, pentachloropropane, hexachloropropane, heptachloropropane, 1-bromopropane, 1,2-dibromopropane, 2,2-dibromopropane, 1,3-dibromopropane, 1,2,3-tribromopropane, 1,4-dibromobutane, 1,5-dibromopentane, 1,6-dibromohexane, 1,7-dibromoheptane, 1,8-dibromooctane, 1-iodopropane, 1,3-diiodopropane, 1,4-diiodobutane, 1,5-diiodopentane, 1,6-diiodohexane, 1,7-diiodoheptane and 1,8-diiodooctane. Examples of preferred solvents among these solvents include aromatic hydrocarbons such as toluene, xylene, mesitylene, 1,2,4-trimethylbenzene, tetralin, anisole, phenetol, veratrole, 1,3-dimethoxybenzene, 1,2,4-trimethoxybenzene, 3,4,5-trimethoxytoluene, 2-methoxytoluene, 2,5-dimethylanisole, chlorobenzene, dichlorobenzene, trichlorobenzene and 1-chloronaphthalene; and halogen hydrocarbons such as chloroform, dichloromethane, 1,2-dibromopropane, 1,3-dibromopropane, 1,2,3-tribromopropane, 1,4-dibromobutane, 1,6-dibromohexane, 1,8-dibromooctane, 1,3-diiodopropane, 1,4-diiodobutane, 1,5-diiodopentane, 1,6-diiodohexane, 1,7-diiodoheptane and 1,8-diiodooctane. In addition, two or more thereof may be mixed for use.

When an organic semiconductor layer is formed by mixing the electron donating organic material using the conjugated polymer having a structure represented by formula (1) and the electron accepting organic material, the electron donating organic material and the electron accepting organic material are added to a solvent at the desired ratio, and by dissolving these by using a method such as heating, stirring, or irradiating with ultrasonic wave, and then the solution is applied onto the transparent electrode. The photoelectric conversion efficiency of the photovoltaic device can be improved by using two or more kinds of the solvents as a mixture. This effect is presumably obtained since the electron donating organic material and the electron accepting organic material are phase-separated in a nano-level so that a carrier path which forms a passing route of electrons and holes is formed.

The solvent to be combined therewith can be selected as an optimal combination depending on the kinds of the electron donating organic materials and the electron accepting organic materials. When the electron donating organic material using the conjugated polymer having a structure represented by formula (1) is used, examples of a preferred combination of the above-mentioned solvents include a combination of chloroform and chlorobenzene. In this case, the mixed volume ratio between chloroform and chlorobenzene is preferably 5:95 to 95:5, and more preferably 10:90 to 90:10.

Moreover, when an organic semiconductor layer is formed by stacking the electron accepting organic material on the electron donating organic material using the conjugated polymer having a structure represented by formula (1), for example, after a solution of the electron donating organic material is applied to form a layer having the electron donating organic material, a solution of the electron accepting organic material is applied thereon to form a layer. When each of the electron donating organic material and the electron accepting organic material is a low-molecular weight substance whose molecular weight is about 1000 or less, the layer may be formed by using a vapor deposition method.

The organic semiconductor layer may be formed by using any of the following methods: a spin coating method, a blade coating method, a slit die coating method, a screen printing method, a bar coating method, a mold coating method, a print transfer method, a dip coating method, an ink-jet method, a spraying method, a vacuum vapor deposition method, and the like, and the formation method may be selected according to the characteristics of an organic semiconductor layer to be obtained such as film-thickness controlling and orientation controlling. For example, when the spin coating method is carried out, the electron donating organic material using the conjugated polymer having a structure represented by formula (1) and the electron accepting organic material preferably have a concentration of 1 to 20 g/l (weight of the electron donating organic material and the electron accepting organic material relative to a volume of the solution containing the electron donating organic material, the electron accepting organic material and the solvent), and by using this concentration, a homogeneous organic semiconductor layer having a thickness of 5 to 200 nm can be easily obtained.

To remove the solvent, the organic semiconductor layer thus formed may be subjected to an annealing treatment under reduced pressure or in an inert atmosphere (in a nitrogen or argon atmosphere). The temperature of the annealing treatment is preferably 40° C. to 300° C., and more preferably 50° C. to 200° C. By performing the annealing treatment, the stacked layers are mutually allowed to permeate each other through the interface, and the effective contact areas consequently increase so that a short-circuit current can be increased. This annealing treatment may be performed after the formation of the negative electrode.

Next, a metal electrode (corresponding to a negative electrode, in this case) made of Al or the like is formed on the organic semiconductor layer by a vacuum vapor deposition method, a sputtering method or the like. When an electron transporting layer is formed by the vacuum vapor deposition by using a low-molecular weight organic material, the metal electrode is preferably formed, with the vacuum state being successively maintained.

When a hole transporting layer is disposed between the positive electrode and the organic semiconductor layer, a desired p-type organic semiconductor material (PEDOT or the like) is applied onto the positive electrode by a spin coating method, a bar coating method, or a casting method by the use of a blade, and then the solvent is removed by using a vacuum thermostat, a hot plate or the like to form the hole transporting layer. When a low-molecular weight organic material, such as phthalocyanine derivatives and porphyrin derivatives, is used, a vacuum vapor deposition method by the use of a vacuum vapor deposition machine may be employed.

When an electron transporting layer is disposed between the organic semiconductor layer and the negative electrode, a desired n-type organic semiconductor material (fullerene derivatives or the like) or n-type inorganic semiconductor material (titanium oxide gel or the like) is applied onto the organic semiconductor layer by a spin coating method, a bar coating method, a casting method by the use of a blade, or a spraying method, and then the solvent is removed by using a vacuum thermostat, a hot plate or the like to form the electron transporting layer. When a low-molecular weight organic material, such as phenanthroline derivatives and $C_{60}$, is used, a vacuum vapor deposition method by the use of a vacuum vapor deposition machine may be employed.

The photovoltaic device can be applicable to various photoelectric conversion devices in which its photoelectric conversion function, photo-rectifying function, or the like is utilized. For example, it is useful for photoelectric cells (solar cells or the like), electron devices (such as a photosensor, photoswitch, phototransistor or the like), photorecording materials (photomemory or the like), imaging devices, and the like.

EXAMPLES

Hereinafter, our polymers, materials and devices will be described in more detail based on examples. In addition, this disclosure is not intended to be limited by the following examples. Also, among compounds which are used in the examples, those indicated by abbreviations are shown below.

ITO: Indium tin oxide
PEDOT: Polyethylene dioxythiophene
PSS: Polystyrene sulfonate
$PC_{70}BM$: Phenyl C71 butyric acid methyl ester
Eg: Band gap
HOMO: Highest occupied molecular orbital
Isc: Short-circuit current density
Voc: Open Circuit Voltage
FF: Fill factor
η: Photoelectric conversion efficiency
E-1 to E-6: Compound represented by the following formula

E-1

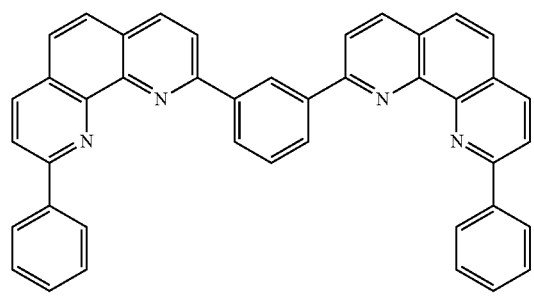

E-2

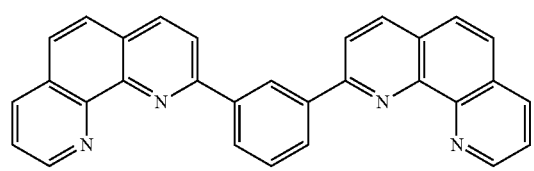

E-3

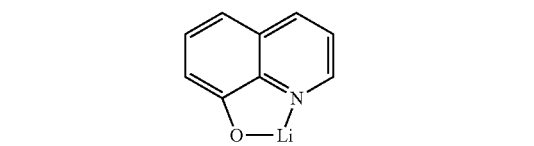

E-4

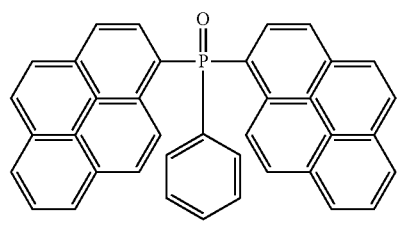

E-5

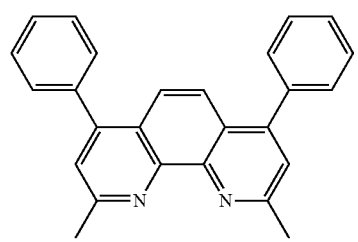

E-6

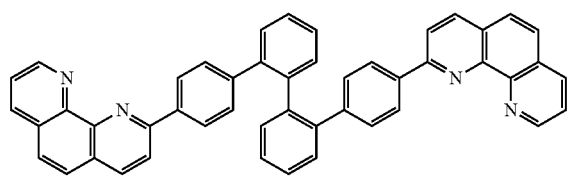

Additionally, for $^1$H-NMR measurements, an FT-NMR device (JEOL JNM-EX270, manufactured by JEOL Ltd.) was used.

The average molecular weight (number-average molecular weight, weight-average molecular weight) was measured by GPC (high-speed GPC device HLC-8320GPC with transported chloroform, manufactured by Tosoh Corporation), and calculated by an absolute calibration curve method. The polymerization degree n was calculated based on the following expression:

Polymerization degree $n$=[(Weight-average molecular weight)/(Molecular weight of repeating unit)

Moreover, with respect to an optical absorption edge wavelength, measurements were carried out on a thin film formed on glass with a thickness of about 60 nm by using a U-3010-type spectrophotometer manufactured by Hitachi, Ltd., and based on the ultraviolet and visible absorption spectrum of the thin film (measured wavelength range: 300 to 900 nm), the optical absorption edge wavelength was obtained.

The band gap (Eg) was calculated from the optical absorption edge wavelength based on the following expression. In addition, the thin film was formed by a spin coating method by using chloroform as a solvent.

$Eg$ (eV)=1240/Optical absorption edge wavelength of thin film (nm)

Further, the highest occupied molecular orbital (HOMO) level was measured on a thin film formed on an ITO glass with a thickness of about 60 nm by using a surface analyzing apparatus (Model AC-2 atmospheric ultraviolet photoelectron spectrometer, manufactured by Rikenkiki Co., Ltd.). In addition, the thin film was formed by a spin coating method by using chloroform as a solvent.

In addition, it is possible to evaluate whether a material is an electron donating organic material or an electron accepting organic material, or p-type semiconductor characteristics or n-type semiconductor characteristics by performing FET measurement or energy level measurement of the thin film described above.

Synthesis Example 1

A compound A-1 was synthesized by the method shown in Scheme 1. In addition, a compound (1-i) and a compound (1-p) described in Synthesis Example 1 were synthesized by reference to a method described in "Journal of the American Chemical Society", Vol. 131, pp. 7792-7799, 2009, and a method described in "Angewandte Chem Internatioal Edition", Vol. 50, pp. 9697-9702, 2011, respectively.

Scheme 1
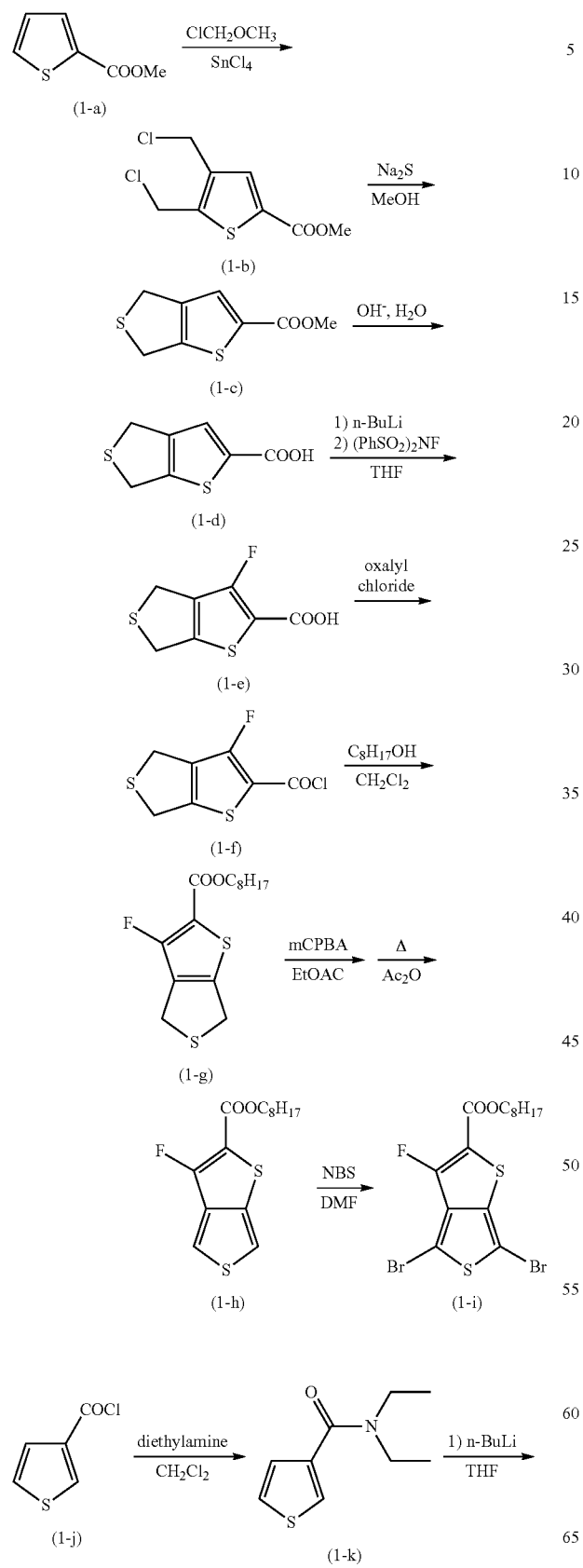
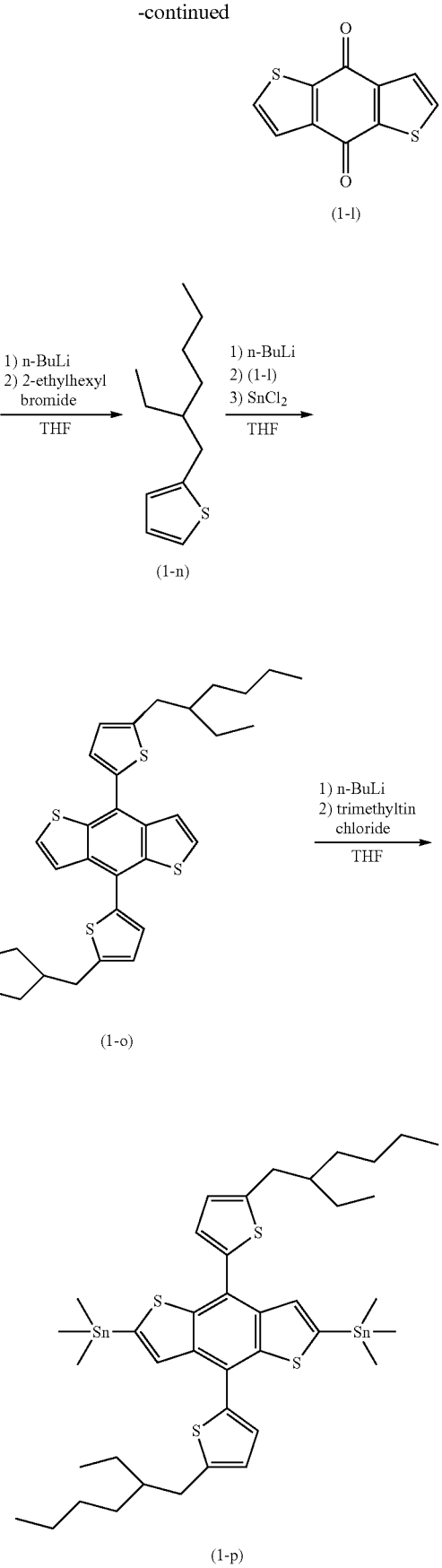

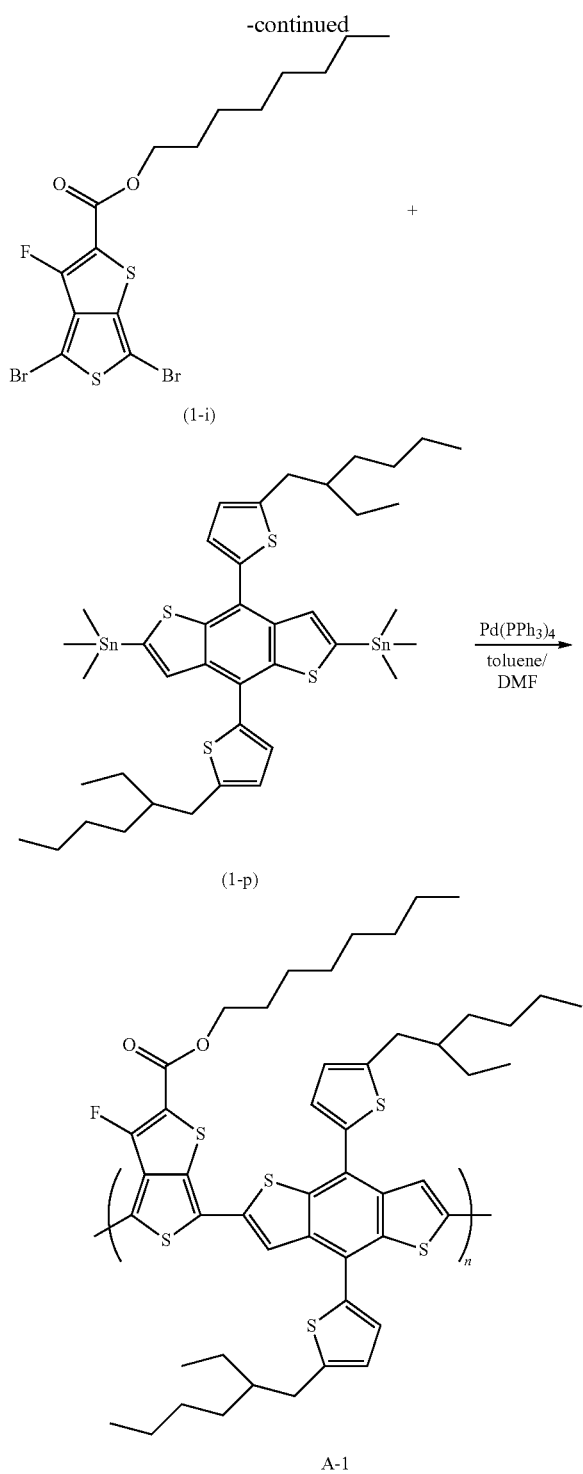

washed with a saturated saline, the solvent was dried with anhydrous magnesium sulfate, and then removed under reduced pressure. The resulting brown solid was recrystallized from methanol to obtain a compound (1-b) as a light yellow solid (24.8 g, yield 39%). The result of $^1$H-NMR measurement on compound (1-b) is shown below:

$^1$H-NMR (270 MHz, CDCl$_3$): 7.71 (s, 1H), 4.79 (s, 1H), 4.59 (s, 1H), 3.88 (s, 3H) ppm.

The compound (1-b) (24.8 g (0.10 mmol)) was dissolved in methanol (1.2 L) (produced by SASAKI CHEMICAL CO., LTD.) and stirred at 60° C., and to this was added dropwise a methanol solution (100 ml) of sodium sulfide (8.9 g (0.11 mol)) (produced by Wako Pure Chemical Industries, Ltd.) over 1 hour, and the resulting mixture was stirred at 60° C. for 4 hours. After completion of a reaction, the solvent was removed under reduced pressure, 200 ml of chloroform and 200 ml of water were added, and the resulting insoluble matter was separated by filtration. The resulting organic layer was washed with water two times and with a saturated saline once, and dried with anhydrous magnesium sulfate, and then the solvent was removed under reduced pressure. A product was refined by silica-gel column chromatography (eluent, chloroform) to obtain a compound (1-c) as a white solid (9.8 g, yield 48%). The result of $^1$H-NMR measurement on compound (1-c) is shown below:

$^1$H-NMR (270 MHz, CDCl$_3$): 7.48 (s, 1H), 4.19 (t, J=3.0 Hz, 2H), 4.05 (t, J=3.0 Hz, 2H), 3.87 (s, 3H) ppm.

To the compound (1-c) (9.8 g (49 mmol)) were added water (100 ml) and then a 3 M aqueous sodium hydroxide solution (30 ml), and the resulting mixture was stirred at 80° C. for 4 hours. After completion of a reaction, 15 ml of a concentrated hydrochloric acid was added at 0° C., the resulting deposited solid matter was separated by filtration and washed with water several times. The resulting solid matter was dried to obtain a compound (1-d) as a white solid (8.9 g, yield 98%). The result of $^1$H-NMR measurement on compound (1-d) is shown below:

$^1$H-NMR (270 MHz, DMSO-d$_6$): 7.46 (s, 1H), 4.18 (t, J=3.2 Hz, 2H), 4.01 (t, J=3.2 Hz, 2H) ppm.

The compound (1-d) (1.46 g (7.8 mmol)) was dissolved in 60 ml of a dehydrated tetrahydrofuran (produced by Wako Pure Chemical Industries, Ltd.) and stirred at −78° C., and to this was added dropwise a n-butyllithium hexane solution (10.7 ml (17.2 mmol)) (1.6 M, produced by Wako Pure Chemical Industries, Ltd.), and the resulting mixture was stirred at −78° C. for 1 hour. Then, a dried tetrahydrofuran solution (20 ml) of N-fluorobenzene sulfonimide (3.19 g (10.1 mmol)) (produced by Tokyo Chemical Industry Co., Ltd.) was added dropwise at −78° C. over 10 minutes, and the resulting mixture was stirred at room temperature for 12 hours. After completion of the reaction, 50 ml of water was added gradually. A 3 M hydrochloric acid solution was added to allow a water layer to be acid, and then the resulting mixture was extracted with chloroform three times. After an organic layer was dried with anhydrous magnesium sulfate, the solvent was distilled off under reduced pressure. After a by-product was removed by silica-gel column chromatography (eluent, ethyl acetate), the resulting product was re-crystallized from ethyl acetate to obtain a compound (1-e) as a light yellow powder (980 mg, yield 61%). The result of $^1$H-NMR measurement on compound (1-e) is shown below:

$^1$H-NMR (270 MHz, DMSO-d$_6$): 13.31 (brs, 1H), 4.20 (t, J=3.0 Hz, 2H), 4.03 (t, J=3.0 Hz, 2H) ppm.

To 10 ml of a dehydrated dichloromethane (produced by Wako Pure Chemical Industries, Ltd.) solution of the compound (1-e) (800 mg (3.9 mmol)) were added oxalyl chloride (1 ml) (Tokyo Chemical Industry Co., Ltd.) and then dimeth- Methyl 2-thiophenecarboxylate (38 g (0.27 mol)) (produced by Tokyo Chemical Industry Co., Ltd.) and chloromethyl methyl ether (108 g (1.34 mol)) (produced by Tokyo Chemical Industry Co., Ltd.) were stirred at 0° C., and to this was added tin tetrachloride (125 g (0.48 mol)) (produced by Wako Pure Chemical Industries, Ltd.) over 1 hour, and the resulting mixture was stirred at room temperature for 8 hours. After completion of stirring, 100 ml of water was added gradually at 0° C., and the resulting mixture was extracted with chloroform three times. The resulting organic layer was ylformamide (one drop) (produced by Wako Pure Chemical Industries, Ltd.), and the resulting mixture was stirred at room temperature for 3 hours. The solvent and excessive oxalyl chloride were removed under reduced pressure to obtain a compound (1-f) as a yellow oil. The compound (1-f) was used for a subsequent reaction as-is.

A dichloromethane solution (10 ml) of the compound (1-f, raw refined product) was added to a dichloromethane solution (15 ml) of 1-octanol (1.3 g (10 mmol)) (produced by Wako Pure Chemical Industries, Ltd.) and triethylamine (800 mg (8 mmol)) (produced by Wako Pure Chemical Industries, Ltd.) at room temperature, and the resulting mixture was stirred at room temperature for 6 hours. The resulting reaction solution was washed with a 1 M hydrochloric acid solution two times, with water once and with a saturated saline once, and dried with anhydrous magnesium sulfate, and then the solvent was distilled off under reduced pressure. The resulting product was refined by silica-gel column chromatography (eluent, chloroform) to obtain a compound (1-g) as a light yellow solid (1.12 g, yield 90%). The result of $^1$H-NMR measurement on compound (1-g) is shown below:

$^1$H-NMR (270 MHz, CDCl$_3$): 4.27 (t, J=6.7 Hz, 2H), 4.16 (t, J=3.0 Hz, 2H), 4.01 (t, J=3.0 Hz, 2H), 1.72 (m, 2H), 1.5-1.3 (m, 12H), 0.88 (t, J=7.0 Hz, 3H) ppm.

To 40 ml of an ethyl acetate solution of the compound (1-g) (1.1 g (3.5 mmol)) was added an ethyl acetate solution (10 ml) of m-chlorobenzoic acid (630 mg (3.6 mmol)) (produced by Nacalai Tesque Inc.) at 0° C., and the resulting mixture was stirred at room temperature for 5 hours. After the solvent was removed under reduced pressure, 30 ml of acetic acid anhydride was added, and the resulting mixture was refluxed for 3 hours. After the solvent was removed again under reduced pressure, the resulting product was refined by silica-gel column chromatography (eluent, dichloromethane:hexane=1:1) to obtain a compound (1-h) as a light yellow oil (1.03 g, yield 94%). The result of $^1$H-NMR measurement on compound (1-h) is shown below:

$^1$H-NMR (270 MHz, CDCl$_3$): 7.65 (d, J=2.7 Hz, 1H), 7.28 (dd, J=2.7 Hz and 5.4 Hz, 1H), 4.31 (t, J=6.8 Hz, 2H), 1.75 (m, 2H), 1.42-1.29 (m, 12H), 0.89 (t, J=6.8 Hz, 3H) ppm.

To 20 ml of a dimethylformamide solution of the compound (1-h) (1.0 g (3.2 mmol)) was added N-bromosuccinimide (1.25 g (7.0 mmol)) (produced by Wako Pure Chemical Industries, Ltd.) at room temperature, and the resulting mixture was stirred at room temperature for 3 hours. After completion of a reaction, 80 ml of ethyl acetate was added, and the resulting organic layer was washed with water five times and with a saturated saline once, and dried with anhydrous magnesium sulfate, and then the solvent was distilled off under reduced pressure. The resulting product was refined by silica-gel column chromatography (eluent, chloroform:hexane=1:3) to obtain a compound (1-i) as a light yellow solid (1.2 g, yield 79%). The result of $^1$H-NMR measurement on compound (1-i) is shown below:

$^1$H-NMR (270 MHz, CDCl$_3$): 4.32 (t, J=6.5 Hz, 2H), 1.75 (m, 2H), 1.42-1.29 (m, 12H), 0.89 (t, J=6.8 Hz, 3H) ppm.

To 300 ml of a dichloromethane solution of diethylamine (110 g (1.5 mol)) (produced by Wako Pure Chemical Industries, Ltd.) was added 3-thiophenecarbonyl chloride (100 g (0.68 mol)) (produced by Wako Pure Chemical Industries, Ltd.) at 0° C. over 1 hour, and the resulting mixture was stirred at room temperature for 3 hours. After completion of stirring, 200 ml of water was added, and the resulting organic layer was washed with water three times and with a saturated saline once. After the organic layer was dried with anhydrous magnesium sulfate, the solvent was distilled off under reduced pressure. A residue was distilled under reduced pressure to obtain a compound (1-k) as a light orange-colored liquid (102 g, yield 82%). The result of $^1$H-NMR measurement on compound (1-k) is shown below:

$^1$H-NMR (270 MHz, CDCl$_3$): 7.47 (dd, J=3.2 Hz and 1.0 Hz, 1H), 7.32 (dd, J=5.0 Hz and 3.2 Hz, 1H), 7.19 (dd, J=5.0 Hz and 1.0 Hz, 1H), 3.43 (brs, 4H), 1.20 (t, J=6.5 Hz, 6H) ppm.

To 400 ml of a dehydrated tetrahydrofuran (produced by Wako Pure Chemical Industries, Ltd.) solution of the compound (1-k) (73.3 g (0.40 mol)) was added dropwise a n-butyllithium hexane solution (250 ml (0.40 mol)) (1.6 M, produced by Wako Pure Chemical Industries, Ltd.) at 0° C. over 30 minutes. After the dropwise addition, the resulting mixture was stirred at room temperature for 4 hours. After completion of stirring, 100 ml of water was added gradually, and the resulting reaction mixture was stirred for a while and then poured in 800 ml of water. The resulting deposited solid was separated by filtration and washed with water, methanol and then hexane to obtain a compound (1-l) as a yellow solid (23.8 g, yield 27%). The result of $^1$H-NMR measurement on compound (1-l) is shown below:

$^1$H-NMR (270 MHz, CDCl$_3$): 7.69 (d, J=4.9 Hz, 2H), 7.64 (d, J=4.9 Hz, 2H) ppm.

To 400 ml of a dehydrated tetrahydrofuran (produced by Wako Pure Chemical Industries, Ltd.) solution of thiophene (42 g (0.50 mol)) was added dropwise a n-butyllithium hexane solution (250 ml (0.40 mol)) (1.6 M, produced by Wako Pure Chemical Industries, Ltd.) at −78° C. over 30 minutes. After the resulting reaction mixture was stirred at −78° C. for 1 hour, 2-ethylhexylbromide (76.4 g (0.40 mol)) (produced by Wako Pure Chemical Industries, Ltd.) was added dropwise at −78° C. over 15 minutes. After the resulting reaction solution was stirred at room temperature for 30 minutes, it was heated and stirred at 60° C. for 6 hours. After completion of stirring, the reaction solution was cooled to room temperature, and to this were added 200 ml of water and 200 ml of ether. The resulting organic layer was washed with water two times and washed with a saturated saline, and dried with anhydrous magnesium sulfate, and then the solvent was distilled off under reduced pressure. A residue was distilled under reduced pressure to obtain a compound (1-n) as a colorless liquid (28.3 g, 36%). The result of $^1$H-NMR measurement on compound (1-n) is shown below:

$^1$H-NMR (270 MHz, CDCl$_3$): 7.11 (d, 4.9 Hz, 1H), 6.92 (dd, 4.9 Hz and 3.2 Hz, 1H), 6.76 (d, J=3.2 Hz, 1H), 2.76 (d, J=6.8 Hz, 2H), 1.62 (m, 1H), 1.4-1.3 (m, 8H), 0.88 (m, 6H) ppm.

To 400 ml of a dehydrated tetrahydrofuran (produced by Wako Pure Chemical Industries, Ltd.) solution of the compound (1-n) (17.5 g (89 mmol)) was added dropwise a n-butyllithium hexane solution (57 ml (89 mmol)) (1.6 M, produced by Wako Pure Chemical Industries, Ltd.) at 0° C. over 30 minutes. After the resulting reaction solution was stirred at 50° C. for 1 hour, the compound (1-l) (4.9 g (22 mmol)) was added at 50° C. and the resulting mixture was stirred for 1 hour as-is. After completion of stirring, the reaction solution was cooled to 0° C., and to this was added a solution formed by dissolving tin chloride dihydrate (39.2 g (175 mmol)) (produced by Wako Pure Chemical Industries, Ltd.) in a 10% hydrochloric acid solution (80 mL), and the resulting mixture was stirred at room temperature for 1 hour. After completion of stirring, 200 ml of water and 200 ml of diethyl ether were added, and the resulting organic layer was washed with water two times and washed with a saturated saline. After the organic layer was dried with anhydrous magnesium sulfate, the solvent was distilled off under reduced pressure. The resulting product was refined by silica-gel column chromatography (eluent, hexane) to obtain a compound (1-o) as a yellow oil (7.7 g, yield 59%). The result of $^1$H-NMR measurement on compound (1-o) is shown below:

$^1$H-NMR (270 MHz, CDCl$_3$): 7.63 (d, J=5.7 Hz, 1H), 7.45 (d, J=5.7 Hz, 1H), 7.29 (d, J=3.6 Hz, 1H), 6.88 (d, J=3.6 Hz, 1H), 2.86 (d, J=7.0 Hz, 2H), 1.70-1.61 (m, 1H), 1.56-1.41 (m, 8H), 0.97-0.89 (m, 6H) ppm.

To 25 ml of a dehydrated tetrahydrofuran (produced by Wako Pure Chemical Industries, Ltd.) solution of the compound (1-o) (870 mg (1.5 mmol)) was added a n-butyllithium hexane solution (2.0 ml (3.3 mmol)) (1.6 M, produced by Wako Pure Chemical Industries, Ltd.) at −78° C. by using a syringe, and the resulting mixture was stirred at −78° C. for 30 minutes and at room temperature for 30 minutes. After the resulting reaction mixture was cooled to −78° C., trimethyltin chloride (800 mg (4.0 mmol)) (produced by Wako Pure Chemical Industries, Ltd.) was added at −78° C. at a time, and the resulting mixture was stirred at room temperature for 4 hours. After completion of stirring, 50 ml of diethyl ether and 50 ml of water were added, and after the resulting mixture was stirred at room temperature for 5 minutes, the resulting organic layer was washed with water two times and washed with a saturated saline. After the solvent was dried with anhydrous sodium sulfate, the solvent was distilled off under reduced pressure. The resulting orange-colored oil was recrystallized from ethanol to obtain a compound (1-p) as a light yellow solid (710 mg, yield 52%). The result of $^1$H-NMR measurement on compound (1-p) is shown below:

$^1$H-NMR (270 MHz, CDCl$_3$): 7.68 (s, 2H), 7.31 (d, J=3.2 Hz, 2H), 6.90 (d, J=3.2 Hz, 2H), 2.87 (d, J=6.2 Hz, 4H), 1.69 (m, 2H), 1.40-1.30 (m, 16H), 1.0-0.9 (m, 12H), 0.39 (s, 18H) ppm.

The compound (1-i) (71 mg (0.15 mmol)) and the compound (1-p) (136 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis(triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound A-1 (85 mg). The compound A-1 had a weight average molecular weight of 25000 and a number average molecular weight of 16000. Further, the compound A-1 had an optical absorption edge wavelength of 783 nm, a bandgap (Eg) of 1.58 eV, and the highest occupied molecular orbital (HOMO) level of −4.95 eV.

Synthesis Example 2

A compound A-2 was synthesized by the method shown in Scheme 2.

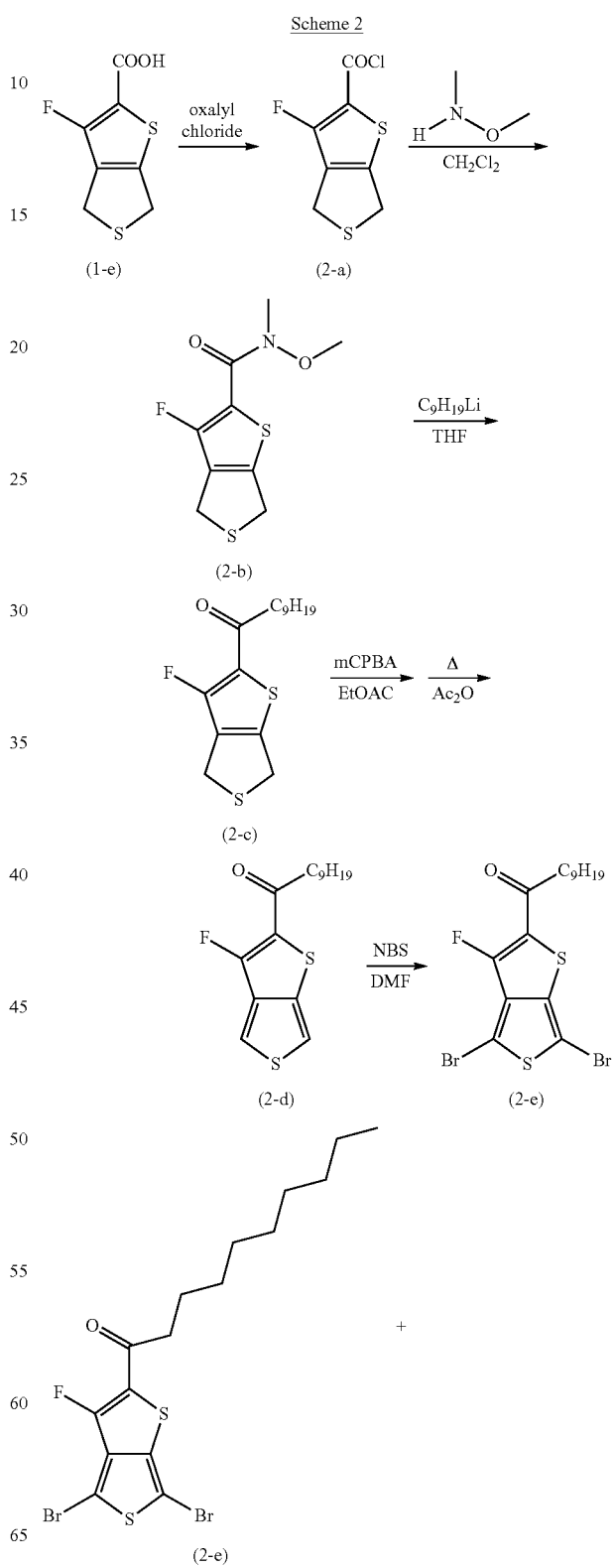

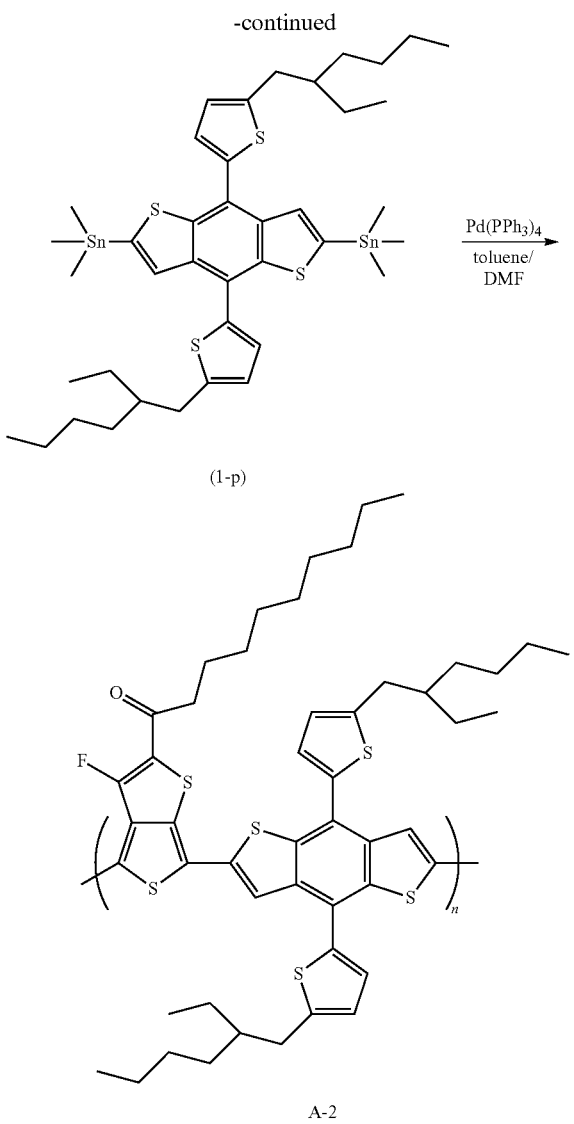

To 30 ml of a dehydrated dichloromethane (produced by Wako Pure Chemical Industries, Ltd.) solution of the compound (1-e) (2.4 g (11.7 mmol)) were added oxalyl chloride (3 ml) (Tokyo Chemical Industry Co., Ltd.) and then dimethylformamide (one drop) (produced by Wako Pure Chemical Industries, Ltd.), and the resulting mixture was stirred at room temperature for 3 hours. The solvent and excessive oxalyl chloride were removed under reduced pressure to obtain a compound (2-a) as a yellow oil. The compound (2-a) was used for a subsequent reaction as-is.

A dichloromethane solution (20 ml) of the compound (2-a, raw refined product) was added to a dichloromethane solution (40 ml) of N-methoxy-N-methylamine hydrochloride (2.7 g (21 mmol)) (produced by Wako Pure Chemical Industries, Ltd.) and triethylamine (5.1 g (50 mmol)) (produced by Wako Pure Chemical Industries, Ltd.) at room temperature, and the resulting mixture was stirred at room temperature for 6 hours. The resulting reaction solution was washed with a 1 M hydrochloric acid solution two times, with water once and with a saturated saline once, and dried with anhydrous magnesium sulfate, and then the solvent was distilled off under reduced pressure. The resulting product was refined by silica-gel column chromatography (eluent, chloroform) to obtain a compound (2-b) as a light yellow solid (1.8 g, yield 62%). The result of $^1$H-NMR measurement on compound (2-b) is shown below:

$^1$H-NMR (270 MHz, CDCl$_3$): 4.17 (s, 2H), 4.04 (s, 2H), 3.73 (s, 1H), 3.36 (s, 1H) ppm.

To 60 ml of a tetrahydrofuran solution of the compound (2-b) (1.5 g (6.1 mmol)) was added dropwise a nonyl-butyl-lithium diethyl ether solution (10 ml (10 mmol)) (1 M, produced by Chemical Soft R&D Inc.) at 0° C. over 10 minutes, and the resulting mixture was stirred at 0° C. for 1 hour. After completion of stirring, 80 ml of diethyl ether was added, and the resulting mixture was washed with water two times and with a saturated saline once, and dried with anhydrous magnesium sulfate, and then the solvent was distilled off under reduced pressure. The resulting product was refined by silica-gel column chromatography (eluent, chloroform:hexane=1:2) to obtain a compound (2-c) as a light yellow solid (1.0 g, yield 54%). The result of $^1$H-NMR measurement on compound (2-c) is shown below:

$^1$H-NMR (270 MHz, CDCl$_3$): 4.16 (s, 2H), 4.01 (s, 2H), 2.82 (t, J=5.9 Hz, 2H), 1.70 (m, 2H), 1.4-1.2 (m, 14H), 0.88 (t, J=6.7 Hz, 3H) ppm.

To 40 ml of an ethyl acetate solution of the compound (2-c) (1.0 g (3.2 mmol)) was added an ethyl acetate solution (10 ml) of m-chlorobenzoic acid (600 mg (3.4 mmol)) (produced by Nacalai Tesque Inc.) at 0° C., and the resulting mixture was stirred at room temperature for 5 hours. After the solvent was removed under reduced pressure, 30 ml of acetic acid anhydride was added, and the resulting mixture was refluxed for 3 hours. After the solvent was removed again under reduced pressure, the resulting product was refined by silica-gel column chromatography (eluent, chloroform:hexane=1:1) to obtain a compound (2-d) as a light yellow oil (780 mg, yield 78%). The result of $^1$H-NMR measurement on compound (2-d) is shown below:

$^1$H-NMR (270 MHz, CDCl$_3$): 7.70 (s, 1H), 7.27 (s, 1H), 2.95 (t, J=6.2 Hz, 2H), 1.72 (m, 2H), 1.4-1.2 (m, 14H), 0.86 (t, J=6.8 Hz, 3H) ppm.

To 20 ml of a dimethylformamide solution of the compound (2-d) (750 mg (2.4 mmol)) was added N-bromosuccinimide (940 mg (5.3 mmol)) (produced by Wako Pure Chemical Industries, Ltd.) at room temperature, and the resulting mixture was stirred at room temperature for 3 hours. After completion of a reaction, 80 ml of ethyl acetate was added, and the resulting organic layer was washed with water five times and with a saturated saline once, and dried with anhydrous magnesium sulfate, and then the solvent was distilled off under reduced pressure. The resulting product was refined by silica-gel column chromatography (eluent, chloroform:hexane=1:3) to obtain a compound (2-e) as a light yellow solid (810 mg, yield 72%). The result of $^1$H-NMR measurement on compound (2-e) is shown below:

$^1$H-NMR (270 MHz, CDCl$_3$): 2.93 (t, J=7.3 Hz, 2H), 1.72 (m, 2H), 1.4-1.2 (m, 14H), 0.88 (t, J=7.0 Hz, 3H) ppm.

The compound (2-e) (71 mg (0.15 mmol)) and the compound (1-p) (136 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis (triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound A-2 (105 mg). The compound A-2 had a weight average molecular weight of 18000 and a number average molecular weight of 13000. Further, the compound A-2 had an optical absorption edge wavelength of 790 nm, a bandgap (Eg) of 1.57 eV, and the highest occupied molecular orbital (HOMO) level of −5.01 eV.

Synthesis Example 3

A compound A-3 was synthesized by the method shown in Scheme 3.

To 80 ml of a dehydrated dichloromethane (produced by Wako Pure Chemical Industries, Ltd.) solution of the compound (1-d) (5.0 g (26.8 mmol)) were added oxalyl chloride (8 ml) (Tokyo Chemical Industry Co., Ltd.) and then dimethylformamide (two drops) (produced by Wako Pure Chemical Industries, Ltd.), and the resulting mixture was stirred at room temperature for 3 hours. The solvent and excessive oxalyl chloride were removed under reduced pressure to obtain a compound (3-a) as a yellow oil. The compound (3-a) was used for a subsequent reaction as-is.

A dichloromethane solution (40 ml) of the compound (3-a, raw refined product) was added to a dichloromethane solution (100 ml) of N-methoxy-N-methylamine hydrochloride (4.7 g (48 mmol)) (produced by Wako Pure Chemical Industries, Ltd.) and triethylamine (11.5 g (115 mmol)) (produced by Wako Pure Chemical Industries, Ltd.) at room temperature, and the resulting mixture was stirred at room temperature for 6 hours. The resulting reaction solution was washed with a 1 M hydrochloric acid solution two times, with water once and with a saturated saline once, and dried with anhydrous magnesium sulfate, and then the solvent was distilled off under reduced pressure. The resulting product was refined by silica-gel column chromatography (eluent, chloroform) to obtain a compound (3-b) as a light yellow solid (5.6 g, yield 91%). The result of $^1$H-NMR measurement on compound (3-b) is shown below:

$^1$H-NMR (270 MHz, CDCl$_3$): 7.64 (s, 1H), 4.20 (s, 2H), 4.07 (s, 2H), 3.77 (s, 1H), 3.36 (s, 1H) ppm To 60 ml of a tetrahydrofuran solution of the compound (3-b) (1.5 g (6.5 mmol)) was added dropwise a nonylmagnesium bromide diethyl ether solution (10 ml (10 mmol)) (1 M, produced by Aldrich Corporation) at 0° C. over 10 minutes, and the resulting mixture was stirred at 0° C. for 1 hour. After completion of stirring, 80 ml of diethyl ether was added, and the resulting mixture was washed with water two times and with a saturated saline once, and dried with anhydrous magnesium sulfate, and then the solvent was distilled off under reduced pressure. The resulting product was refined by silica-gel column chromatography (eluent, chloroform:hexane=1:2) to obtain a compound (3-c) as a light yellow solid matter (1.7 g, yield 87%). The result of $^1$H-NMR measurement on compound (3-c) is shown below:

$^1$H-NMR (270 MHz, CDCl$_3$): 7.38 (s, 1H), 4.20 (s, 2H), 4.06 (s, 2H), 2.81 (t, J=7.3 Hz, 2H), 1.70 (m, 2H), 1.4-1.2 (m, 14H), 0.88 (t, J=7.0 Hz, 3H) ppm.

To 60 ml of an ethyl acetate solution of the compound (3-c) (1.5 g (5.1 mmol)) was added an ethyl acetate solution (10 ml) of m-chlorobenzoic acid (900 mg (5.2 mmol)) (produced by Nacalai Tesque Inc.) at 0° C., and the resulting mixture was stirred at room temperature for 5 hours. After the solvent was removed under reduced pressure, 40 ml of acetic acid anhydride was added, and the resulting mixture was refluxed for 3 hours. After the solvent was removed again under reduced pressure, the resulting product was refined by silica-gel column chromatography (eluent, chloroform:hexane=1:1) to obtain a compound (3-d) as a light yellow oil (1.2 g, yield 81%). The result of $^1$H-NMR measurement on compound (3-d) is shown below:

$^1$H-NMR (270 MHz, CDCl$_3$): 7.64 (s, 1H), 7.60 (s, 1H), 7.28 (s, 1H), 2.90 (t, J=7.3 Hz, 2H), 1.76 (m, 2H), 1.4-1.2 (m, 14H), 0.88 (t, J=6.7 Hz, 3H) ppm.

To 30 ml of a dimethylformamide solution of the compound (3-d) (1.0 g (3.4 mmol)) was added N-bromosuccinimide (1.33 g (7.5 mmol)) (produced by Wako Pure Chemical Industries, Ltd.) at room temperature, and the resulting mixture was stirred at room temperature for 3 hours. After completion of a reaction, 80 ml of ethyl acetate was added, and the resulting organic layer was washed with water five times and with a saturated saline once, and dried with anhydrous magnesium sulfate, and then the solvent was distilled off under reduced pressure. The resulting product was refined by silica-gel column chromatography (eluent, chloroform:hexane=1:3) to obtain a compound (3-e) as a light yellow solid (1.2 g, yield 78%). The result of $^1$H-NMR measurement on compound (3-e) is shown below:

$^1$H-NMR (270 MHz, CDCl$_3$): 7.39 (s, 1H), 2.90 (t, J=7.3 Hz, 2H), 1.75 (m, 2H), 1.4-1.2 (m, 14H), 0.88 (t, J=7.0 Hz, 3H) ppm.

The compound (3-e) (68 mg (0.15 mmol)) and the compound (1-p) (136 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis(triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound A-3 (102 mg). The compound A-3 had a weight average molecular weight of 36000 and a number average molecular weight of 19000. Further, the compound A-3 had an optical absorption edge wavelength of 800 nm, a bandgap (Eg) of 1.55 eV, and the highest occupied molecular orbital (HOMO) level of −5.00 eV.

Synthesis Example 4

A compound A-4 was synthesized by the method shown in Scheme 4. In addition, a compound (4-a) described in Synthesis Example 4 was synthesized by reference to a method described in "Journal of the American Chemical Society", Vol. 131, pp. 7792-7799, 2009.

Scheme 4
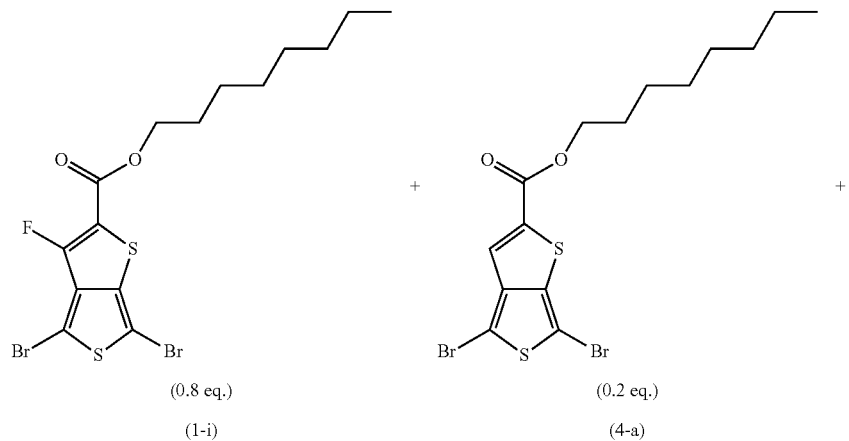
(0.8 eq.)
(1-i)
(0.2 eq.)
(4-a)
+
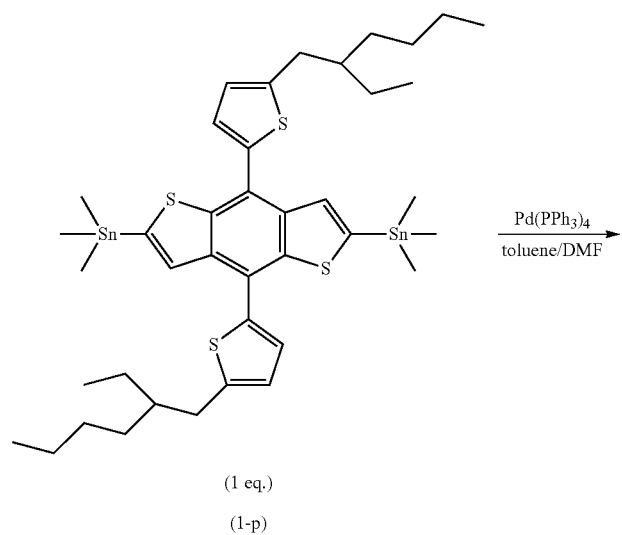
(1 eq.)
(1-p)

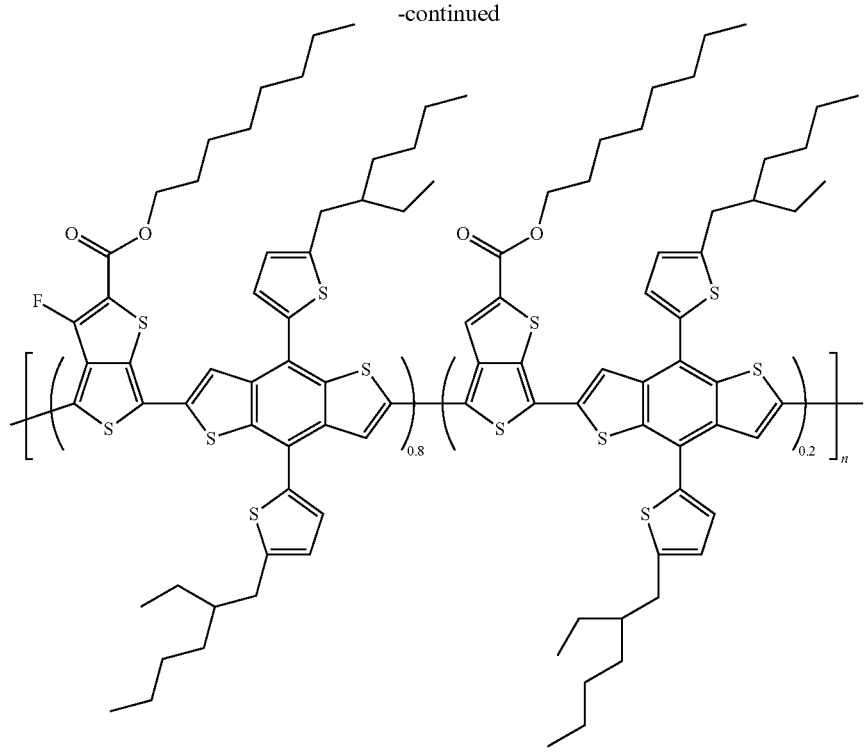

A-4

The compound (1-i) (56.7 mg (0.12 mmol)), the compound (4-a) (13.6 mg (0.03 mmol)) and the compound (1-p) (136 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis(triphenyl phosphine) palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound A-4 (92 mg). The compound A-4 had a weight average molecular weight of 28000 and a number average molecular weight of 17000. Further, the compound A-4 had an optical absorption edge wavelength of 784 nm, a bandgap (Eg) of 1.58 eV, and the highest occupied molecular orbital (HOMO) level of −4.95 eV.

Synthesis Example 5

A compound B-1 was synthesized by the method shown in Scheme 5. In addition, a compound (5-c) and (5-e) described in Synthesis Example 5 were synthesized by reference to a method described in "Journal of the American Chemical Society", Vol. 131, pp. 7792-7799, 2009.

Scheme 5

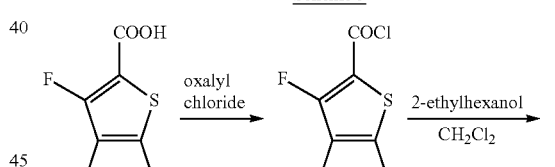

(1-e)      (1-f)

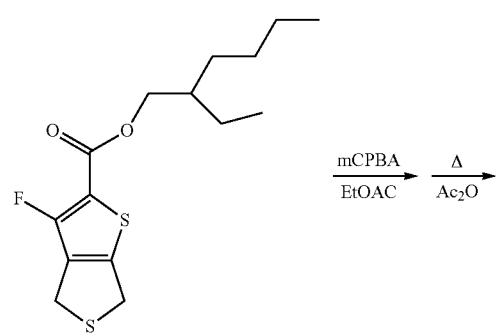

(5-a)

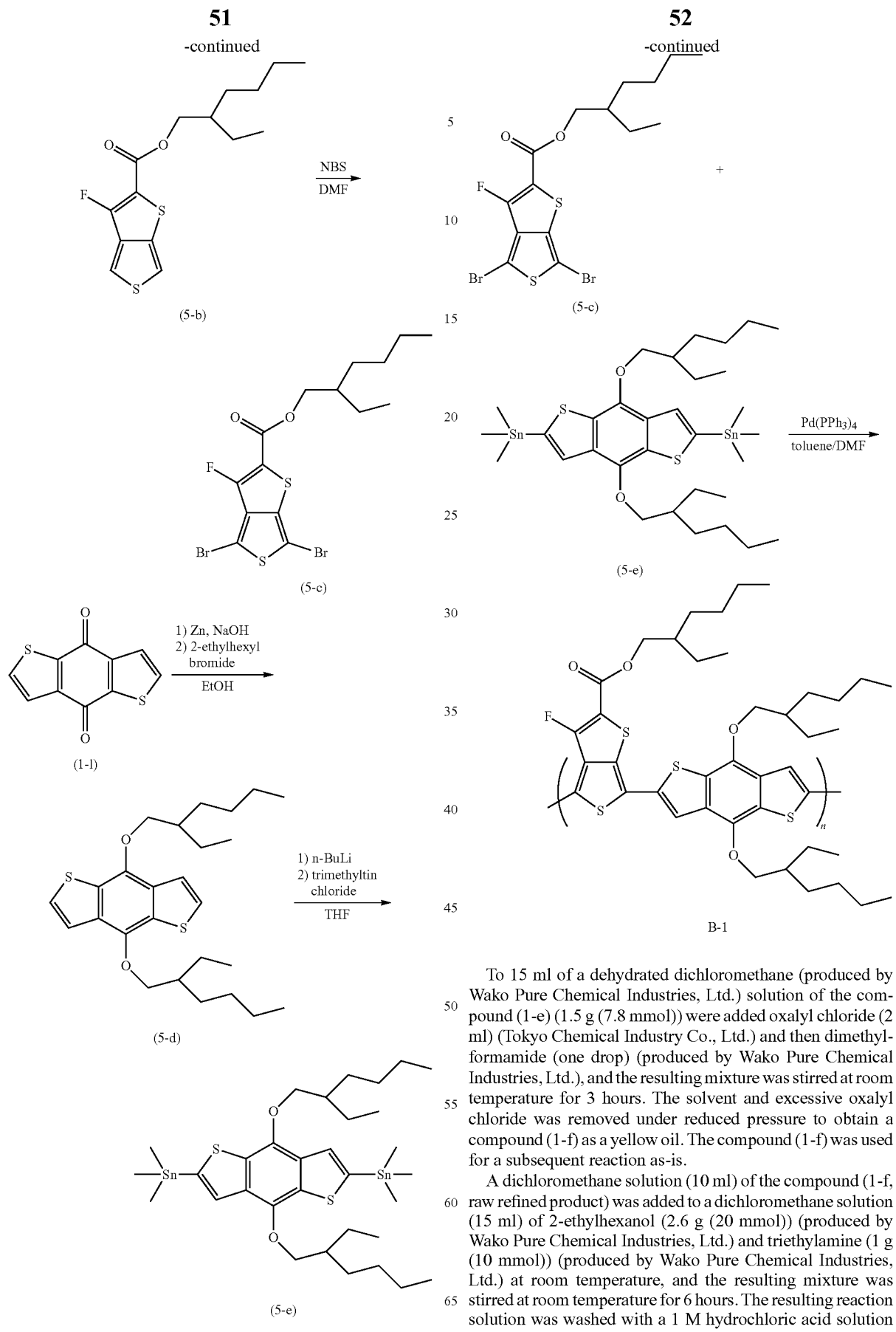

To 15 ml of a dehydrated dichloromethane (produced by Wako Pure Chemical Industries, Ltd.) solution of the compound (1-e) (1.5 g (7.8 mmol)) were added oxalyl chloride (2 ml) (Tokyo Chemical Industry Co., Ltd.) and then dimethylformamide (one drop) (produced by Wako Pure Chemical Industries, Ltd.), and the resulting mixture was stirred at room temperature for 3 hours. The solvent and excessive oxalyl chloride was removed under reduced pressure to obtain a compound (1-f) as a yellow oil. The compound (1-f) was used for a subsequent reaction as-is.

A dichloromethane solution (10 ml) of the compound (1-f, raw refined product) was added to a dichloromethane solution (15 ml) of 2-ethylhexanol (2.6 g (20 mmol)) (produced by Wako Pure Chemical Industries, Ltd.) and triethylamine (1 g (10 mmol)) (produced by Wako Pure Chemical Industries, Ltd.) at room temperature, and the resulting mixture was stirred at room temperature for 6 hours. The resulting reaction solution was washed with a 1 M hydrochloric acid solution two times, with water once and with a saturated saline once, and dried with anhydrous magnesium sulfate, and then the solvent was distilled off under reduced pressure. The resulting product was passed through a silica-gel column (eluent: chloroform), and the solvent was distilled off under reduced pressure to obtain a compound (5-a) as a light yellow oil (raw refined product). The compound (5-a) was used for a subsequent reaction as-is.

To 60 ml of an ethyl acetate solution of the compound (5-a, raw refined product) was added dropwise an ethyl acetate solution (20 ml) of m-chlorobenzoic acid (1.37 g (7.8 mmol)) (produced by Nacalai Tesque Inc.) at 0° C., and the resulting mixture was stirred at room temperature for 5 hours. After the solvent was removed under reduced pressure, 30 ml of acetic acid anhydride was added, and the resulting mixture was heated/refluxed for 3 hours. After the solvent was removed again under reduced pressure, the resulting product was refined by silica-gel column chromatography (eluent, dichloromethane:hexane=1:1) to obtain a compound (5-b) as a light yellow oil (1.30 g). The result of $^1$H-NMR measurement on compound (5-b) is shown below:

$^1$H-NMR (270 MHz, CDCl$_3$): 7.66 (s, 1H), 7.28 (s, 1H), 4.23 (d, J=5.9 Hz, 2H), 1.61 (m, 1H), 1.5-1.2 (m, 8H), 0.9 (m, 6H) ppm.

To 20 ml of a dimethylformamide solution of the compound (5-b) (1.0 g (3.2 mmol)) was added N-bromosuccinimide (1.25 g (7.0 mmol)) (produced by Wako Pure Chemical Industries, Ltd.) at room temperature, and the resulting mixture was stirred at room temperature for 3 hours. After completion of a reaction, 80 ml of ethyl acetate was added, and the resulting organic layer was washed with water five times and with a saturated saline once, and dried with anhydrous magnesium sulfate, and then the solvent was distilled off under reduced pressure. The resulting product was refined by silica-gel column chromatography (eluent, chloroform:hexane=1:3) to obtain a compound (5-c) as a light yellow oil (1.1 g, yield 73%). The result of $^1$H-NMR measurement on compound (5-c) is shown below:

$^1$H-NMR (270 MHz, CDCl$_3$): 4.25 (d, J=5.7 Hz, 2H), 1.69 (s, 1H), 1.5-1.2 (m, 6H), 0.94 (t, J=6.8 Hz, 3H), 0.91 (t, J=6.8 Hz, 3H) ppm.

To the compound (1-l) (8.4 g (38 mmol)) were added ethanol (30 ml), a 20% aqueous sodium hydroxide solution (120 ml), and a zinc powder (5.3 g (80 mmol)) (produced by Wako Pure Chemical Industries, Ltd.), and the resulting reaction mixture was refluxed for 1 hour. To the resulting product was added 2-ethylhexylbromide (25.0 g (0.11 mol)) (produced by Wako Pure Chemical Industries, Ltd.), and the resulting reaction mixture was further refluxed for 4 hours. After completion of a reaction, the reaction mixture was cooled to room temperature, and to this were added 100 ml of water and 100 ml of chloroform. After the reaction mixture was passed through celite to be filtered, a water layer was extracted with chloroform two times. The resulting organic layer was washed with water two times and with a saturated saline once, and dried with anhydrous magnesium sulfate, and then the solvent was distilled off under reduced pressure. The resulting product was refined by silica-gel column chromatography (eluent, chloroform:hexane=1:5) to obtain a compound (5-d) as a light yellow oil (4.4 g, yield 26%). The result of $^1$H-NMR measurement on compound (5-d) is shown below:

$^1$H-NMR (270 MHz, CDCl$_3$): 7.47 (d, J=5.7 Hz, 2H), 7.36 (d, J=5.7 Hz, 2H), 4.18 (d, J=5.1 Hz, 4H), 1.9-0.8 (m, 34H) ppm.

To 50 ml of a dehydrated tetrahydrofuran (produced by Wako Pure Chemical Industries, Ltd.) solution of the compound (5-d) (1.47 g (3.3 mmol)) was added dropwise a n-butyllithium hexane solution (13.2 ml (8.3 mmol)) (1.6 M, produced by Wako Pure Chemical Industries, Ltd.) at −78° C. After the reaction solution was stirred at −78° C. for 30 minutes and at room temperature for 30 minutes, and to this was added trimethyltin chloride (2.0 g (10 mol)) (produced by Tokyo Chemical Industry Co., Ltd.) at −78° C. After the reaction solution was stirred at room temperature for 6 hours, 80 ml of hexane and 20 ml of water were added, and the resulting organic layer was washed with water three times. After the organic layer was dried with anhydrous sodium sulfate, the solvent was distilled off under reduced pressure. The resulting product was recrystallized from isopropanol to obtain a compound (5-e) as a white solid (1.60 g, yield 63%). The result of $^1$H-NMR measurement on compound (5-e) is shown below:

$^1$H-NMR (270 MHz, CDCl$_3$): 7.51 (s, 2H), 4.19 (d, J=5.1 Hz, 4H), 1.8-1.4 (m, 22H), 1.03 (t, J=7.3 Hz, 6H), 0.94 (t, J=7.3 Hz, 6H), 0.44 (s, 18H) ppm.

The compound (5-c) (71 mg (0.15 mmol)) and the compound (5-e) (116 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis (triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound B-1 (73 mg). The compound B-1 had a weight average molecular weight of 31000 and a number average molecular weight of 13000. Further, the compound B-1 had an optical absorption edge wavelength of 754 nm, a bandgap (Eg) of 1.64 eV, and the highest occupied molecular orbital (HOMO) level of −5.09 eV.

Synthesis Example 6

A compound B-2 was synthesized by the method shown in Scheme 6.

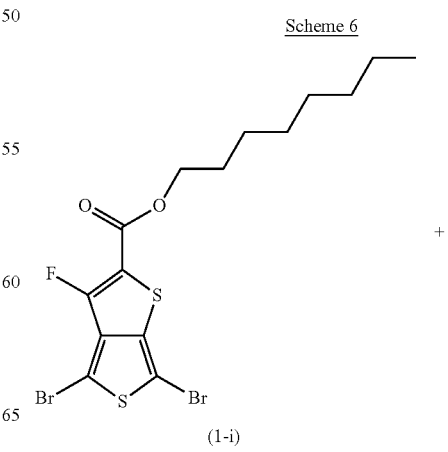

Scheme 6

(1-i)

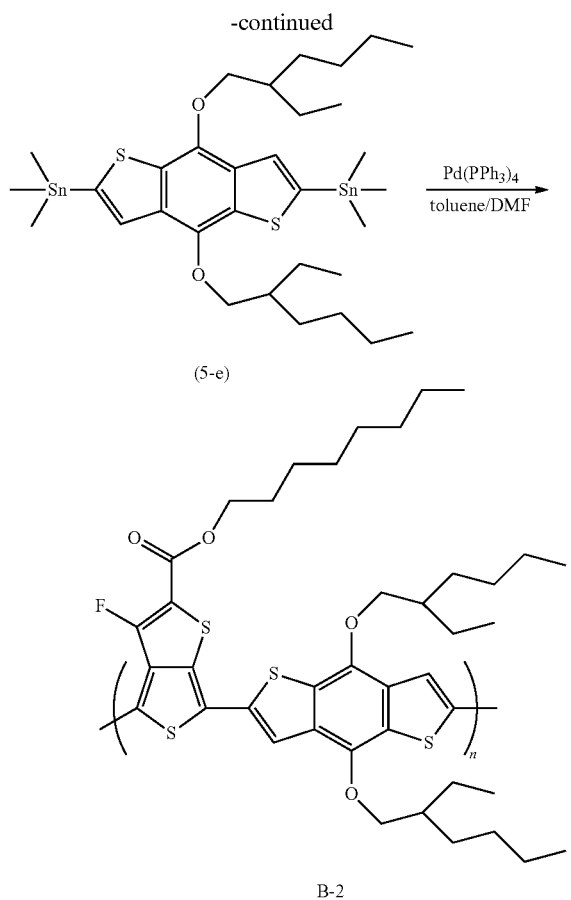

(5-e)

B-2

The compound (1-i) (71 mg (0.15 mmol)) and the compound (5-e) (116 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis (triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound B-2 (82 mg). The compound B-2 had a weight average molecular weight of 22000 and a number average molecular weight of 11000. Further, the compound B-2 had an optical absorption edge wavelength of 755 nm, a bandgap (Eg) of 1.64 eV, and the highest occupied molecular orbital (HOMO) level of −5.06 eV.

Synthesis Example 7

A compound B-3 was synthesized by the method shown in Scheme 7. In addition, a compound (7-a) described in Synthesis Example 7 was synthesized by reference to a method described in "Journal of the American Chemical Society", Vol. 131, pp. 7792-7799, 2009.

Scheme 7

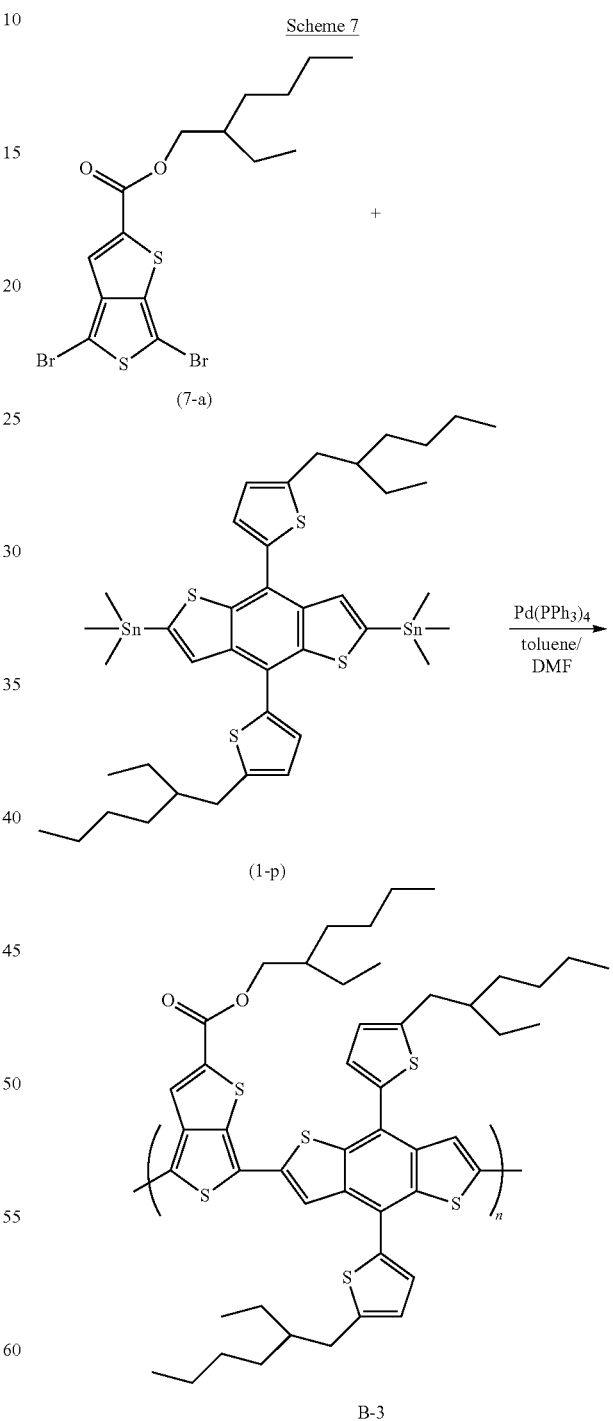

(7-a)

(1-p)

B-3

The compound (7-a) (68 mg (0.15 mmol)) and the compound (1-p) (136 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis(triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound B-3 (80 mg). The compound B-3 had a weight average molecular weight of 35000 and a number average molecular weight of 17000. Further, the compound B-3 had an optical absorption edge wavelength of 784 nm, a bandgap (Eg) of 1.58 eV, and the highest occupied molecular orbital (HOMO) level of −4.91 eV.

Synthesis Example 8

A compound B-4 was synthesized by the method shown in Scheme 8. In addition, a compound (8-a) described in Synthesis Example 8 was synthesized by reference to a method described in "Journal of the American Chemical Society", Vol. 131, pp. 15586-15587, 2009.

Scheme 8

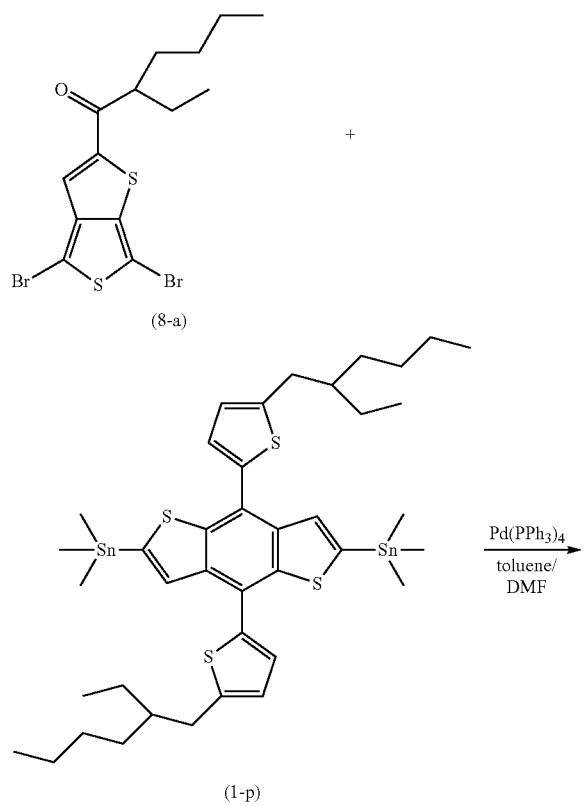

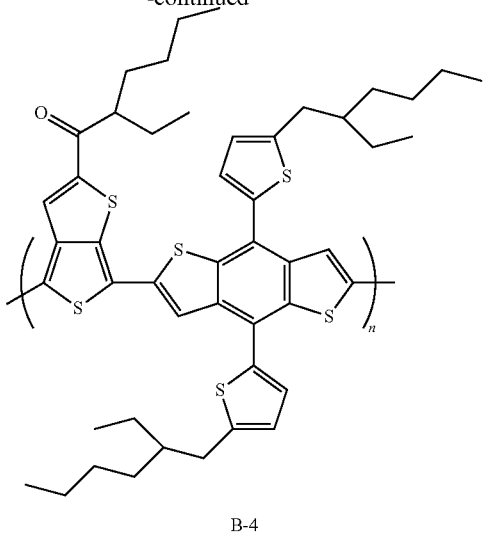

B-4

The compound (5-a) (64 mg (0.15 mmol)) and the compound (1-p) (136 mg (0.15 mmol)) were dissolved in toluene (4 ml) (produced by Wako Pure Chemical Industries, Ltd.) and dimethylformamide (1 ml) (produced by Wako Pure Chemical Industries, Ltd.), and to this was added tetrakis(triphenyl phosphine)palladium (5 mg) (produced by Tokyo Chemical Industry Co., Ltd.), and the resulting mixture was stirred at 100° C. for 15 hours in a nitrogen atmosphere. Next, to this was added 15 mg of bromobenzene (produced by Tokyo Chemical Industry Co., Ltd.), and stirred at 100° C. for 1 hour. Then, 40 mg of tributyl(2-thienyl)tin (produced by Tokyo Chemical Industry Co., Ltd.) was added and the resulting mixture was further stirred at 100° C. for 1 hour. After completion of stirring, the resulting reaction mixture was cooled to room temperature and poured in 100 ml of methanol. The resulting deposited solid matter was separated by filtration and washed with methanol, water and then acetone. Then, the solid matter was washed with acetone and hexane in this order using a Soxhlet extractor. Next, after the solid matter was dissolved in chloroform, and resulting chloroform solution was passed through celite (produced by Nacalai Tesque Inc.) and subsequently through a silica-gel column (eluent: chloroform), the solvent was distilled off under reduced pressure. The resulting solid matter was dissolved in chloroform again, and then re-precipitated in methanol to obtain a compound B-4 (73 mg). The compound B-4 had a weight average molecular weight of 21000 and a number average molecular weight of 11000. Further, the compound B-4 had an optical absorption edge wavelength of 785 nm, a bandgap (Eg) of 1.58 eV, and the highest occupied molecular orbital (HOMO) level of −4.92 eV.

Example 1

The above-mentioned compound (A-1) (1 mg) and $PC_{70}BM$ (1 mg) (produced by Solenne BV) were added to 0.20 ml of a chloroform solution containing 1,8-diiodooctane (produced by Wako Pure Chemical Industries, Ltd.) at a rate of 3% by volume, and a container containing the chloroform solution was irradiated with ultrasonic waves for 30 minutes in a ultrasonic cleaning machine (US-2 (trade name) manufactured by Iuchi Seieido Co., Ltd., output: 120 W) to obtain a solution A (a weight ratio between a donor and an acceptor is 1:1). Further, the compound (A-1) (1 mg) and $PC_{70}BM$ (1.5 mg) (produced by Solenne BV) were put into a sample bottle containing 0.25 ml of a chloroform solution (volume concentration of 3%) of 1,8-diiodooctane (produced by Wako Pure Chemical Industries, Ltd.), and this was irradiated with ultrasonic waves for 30 minutes in a ultrasonic cleaning machine (US-2 (trade name) manufactured by Iuchi Seieido Co., Ltd., output: 120 W) to obtain a solution B (a weight ratio between a donor and an acceptor is 1:1.5).

A glass substrate on which an ITO transparent conductive layer serving as a positive electrode was deposited at a thickness of 125 nm by a sputtering method was cut into a size of 38 mm×46 mm, and the ITO layer was then patterned into a rectangular shape of 38 mm×13 mm by a photolithography method. The resulting substrate was cleaned with ultrasonic waves for 10 minutes in an alkali cleaning solution ("Semicoclean" EL56 (trade name), produced by Furuuchi Chemical Corporation), and then washed with ultrapure water.

After this substrate was subjected to a UV/ozone treatment for 30 minutes, an aqueous PEDOT:PSS solution (PEDOT 0.8% by weight, PPS 0.5% by weight) to be used to form a hole transporting layer was applied onto the substrate by a spin coating method so as to form a film with a thickness of 60 nm. After being heated and dried at 200° C. for 5 minutes by using a hot plate, the above-mentioned solution A or solution B was added dropwise to the PEDOT:PPS layer and an organic semiconductor layer having a film thickness of 130 nm was formed by a spin coating method. Thereafter, the substrate with the organic semiconductor layer formed thereon and a mask for a negative electrode were placed in a vacuum vapor deposition apparatus, and the apparatus was again evacuated until the degree of vacuum inside the apparatus reached $1 \times 10^{-3}$ Pa or less and a lithium fluoride layer was vapor-deposited with a thickness of 0.1 nm by a resistive heating method. Thereafter, an aluminum layer serving as a negative electrode was vapor-deposited with a thickness of 80 nm. Thus, a photovoltaic device, in which an area of an intersection portion of the stripe-shaped ITO layer and the stripe-shaped aluminum layer is 2 mm×2 mm, was prepared.

Figure 5:
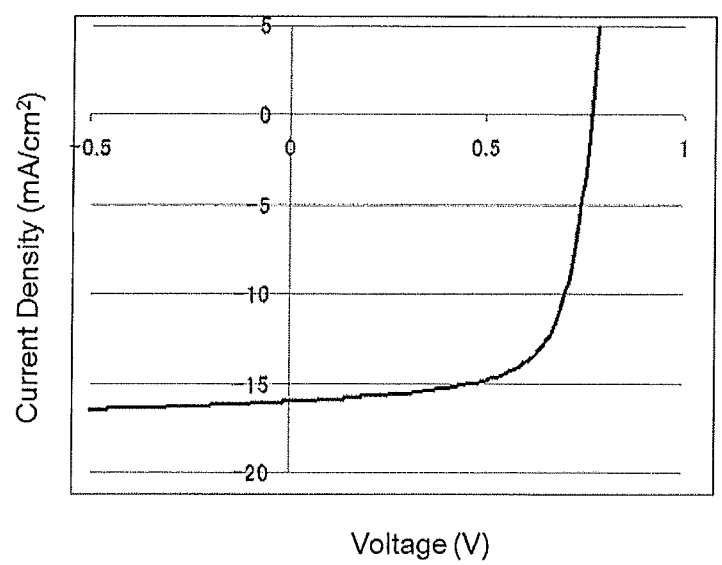
FIG. 5 is a voltage-current density curve of Example 1 (ratio between a donor and an acceptor is 1:1).

The positive and negative electrodes of the photovoltaic device thus prepared were connected to a 2400 series SourceMeter manufactured by TFF Corporation Keithley Instruments, and the device was irradiated with pseudo-solar light (OTENTO-SUNIII manufactured by Bunkoukeiki Co., Ltd., spectral-shape: AM 1.5, Intensity: 100 mW/cm$^2$) from the ITO layer side in the atmosphere, and the current value was measured, with the applied voltage being varied from −1 V to +2 V. Results of the measurement are shown in FIG. 5. In the photovoltaic device using the solution A (the weight ratio between a donor and an acceptor was 1:1), the short-circuit current density (value of the current density when the applied voltage is 0 V) was 15.99 A/cm$^2$, the open circuit voltage (value of the applied voltage when the current density is 0) was 0.76 V, and the fill factor (FF) was 0.69, and the photoelectric conversion efficiency calculated based upon these values was 8.39%. The voltage-current density curve in this is shown in FIG. 5. FIG. 5 is a graph with a voltage on the horizontal-axis and an current density on the vertical-axis. Further, in the photovoltaic device using the solution B (the weight ratio between a donor and an acceptor was 1:1.5), the short-circuit current density was 13.56 A/cm$^2$, the open circuit voltage was 0.76 V, and the fill factor (FF) was 0.68, and the photoelectric conversion efficiency calculated based on these values was 7.01%.

The fill factor and the photoelectric conversion efficiency were calculated from the following expression:

Fill factor=$IV$max (mA·V/cm$^2$)/(Short-circuit current density(mA/cm$^2$)×Open circuit voltage (V))

wherein, IVmax corresponds to a value of product of the current density and the applied voltage at a point where the product of the current density and the applied voltage becomes the largest with the applied voltage between 0 V and the open circuit voltage value. Photoelectric conversion efficiency=[(Short-circuit current density (mA/cm$^2$)×Open circuit voltage (V)×Fill factor)/Intensity of pseudo-solar light (100 mW/cm$^2$)]×100(%) In the following examples and comparative examples, all the fill factor and photoelectric conversion efficiency were calculated from the above-mentioned expression.

Example 2

A photovoltaic device was prepared, and the current-voltage characteristics were measured in the same manner as in Example 1 except for using the above-mentioned compound A-2 in place of the compound A-1. In the characteristics of the device using the solution in which the weight ratio between a donor and an acceptor was 1:1, the short-circuit current density was 13.71 mA/cm$^2$, the open circuit voltage was 0.81 V, and the fill factor (FF) was 0.65, and the photoelectric conversion efficiency calculated based on these values was 7.22%. Further, in the characteristics of the device using the solution in which the weight ratio between a donor and an acceptor was 1:1.5, the short-circuit current density was 14.04 mA/cm$^2$, the open circuit voltage was 0.81 V, and the fill factor (FF) was 0.66, and the photoelectric conversion efficiency calculated based on these values was 7.51%.

Example 3

A photovoltaic device was prepared, and the current-voltage characteristics were measured in the same manner as in Example 1 except for using the above-mentioned compound A-3 in place of the compound A-1. In the characteristics of the device using the solution in which the weight ratio between a donor and an acceptor was 1:1, the short-circuit current density was 13.71 mA/cm$^2$, the open circuit voltage was 0.73 V, and the fill factor (FF) was 0.68, and the photoelectric conversion efficiency calculated based on these values was 6.81%. Further, in the characteristics of the device using the solution in which the weight ratio between a donor and an acceptor was 1:1.5, the short-circuit current density was 13.94 mA/cm$^2$, the open circuit voltage was 0.73 V, and the fill factor (FF) was 0.68, and the photoelectric conversion efficiency calculated based on these values was 6.92%.

Example 4

A photovoltaic device was prepared, and the current-voltage characteristics were measured in the same manner as in Example 1 except for using the above-mentioned compound A-4 in place of the compound A-1. In the characteristics of the device using the solution in which the weight ratio between a donor and an acceptor was 1:1, the short-circuit current density was 13.75 mA/cm$^2$, the open circuit voltage was 0.76 V, and the fill factor (FF) was 0.68, and the photoelectric conversion efficiency calculated based on these values was 7.11%. Further, in the characteristics of the device using the solution in which the weight ratio between a donor and an acceptor was 1:1.5, the short-circuit current density was 13.42 mA/cm$^2$, the open circuit voltage was 0.76 V, and the fill factor (FF) was 0.67, and the photoelectric conversion efficiency calculated based on these values was 6.83%.

Comparative Example 1

A photovoltaic device was prepared, and the current-voltage characteristics were measured in the same manner as in Example 1 except for using the above-mentioned compound B-1 in place of the compound A-1. In the characteristics of the device using the solution in which the weight ratio between a donor and an acceptor was 1:1, the short-circuit current density was 11.20 mA/cm$^2$, the open circuit voltage was 0.74 V, and the fill factor (FF) was 0.59, and the photoelectric conversion efficiency calculated based on these values was 4.89%. Further, in the characteristics of the device using the solution in which the weight ratio between a donor and an acceptor was 1:1.5, the short-circuit current density was 12.74 mA/cm$^2$, the open circuit voltage was 0.74 V, and the fill factor (FF) was 0.66, and the photoelectric conversion efficiency calculated based on these values was 6.39%.

Comparative Example 2

A photovoltaic device was prepared, and the current-voltage characteristics were measured in the same manner as in Example 1 except for using the above-mentioned compound B-2 in place of the compound A-1. In the characteristics of the device using the solution in which the weight ratio between a donor and an acceptor was 1:1, the short-circuit current density was 11.44 mA/cm$^2$, the open circuit voltage was 0.74 V, and the fill factor (FF) was 0.62, and the photoelectric conversion efficiency calculated based on these values was 5.25%. Further, in the characteristics of the device using the solution in which the weight ratio between a donor and an acceptor was 1:1.5, the short-circuit current density was 11.22 mA/cm$^2$, the open circuit voltage was 0.74 V, and the fill factor (FF) was 0.60, and the photoelectric conversion efficiency calculated based on these values was 4.98%.

Comparative Example 3

A photovoltaic device was prepared, and the current-voltage characteristics were measured in the same manner as in Example 1 except for using the above-mentioned compound B-3 in place of the compound A-1. In the characteristics of the device using the solution in which the weight ratio between a donor and an acceptor was 1:1, the short-circuit current density was 11.19 mA/cm$^2$, the open circuit voltage was 0.68 V, and the fill factor (FF) was 0.57, and the photoelectric conversion efficiency calculated based on these values was 4.34%. Further, in the characteristics of the device using the solution in which the weight ratio between a donor and an acceptor was 1:1.5, the short-circuit current density was 12.56 mA/cm$^2$, the open circuit voltage was 0.68 V, and the fill factor (FF) was 0.55, and the photoelectric conversion efficiency calculated based on these values was 4.70%.

Comparative Example 4

A photovoltaic device was prepared, and the current-voltage characteristics were measured in the same manner as in Example 1 except for using the above-mentioned compound B-4 in place of the compound A-1. In the characteristics of the device using the solution in which the weight ratio between a donor and an acceptor was 1:1, the short-circuit current density was 13.51 mA/cm$^2$, the open circuit voltage was 0.74 V, and the fill factor (FF) was 0.59, and the photoelectric conversion efficiency calculated based on these values was 5.90%. Further, in the characteristics of the device using the solution in which the weight ratio between a donor and an acceptor was 1:1.5, the short-circuit current density was 15.02 mA/cm$^2$, the open circuit voltage was 0.74 V, and the fill factor (FF) was 0.61, and the photoelectric conversion efficiency calculated based on these values was 6.78%.

TABLE 1

| | Electron Donating Organic Material | Ratio between Donor and Acceptor | Electron Transporting Layer | Electron Extraction Layer | Negative Electrode | Short-Circuit Current Density (mA/cm$^2$) | Open Circuit Voltage (V) | Fill Factor | Photoelectric Conversion Efficiency (%) |
|---|---|---|---|---|---|---|---|---|---|
| Example 1 | A-1 | 1:1 | — | LiF | Al | 15.99 | 0.76 | 0.69 | 8.39 |
| | | 1:1.5 | — | LiF | Al | 13.56 | 0.76 | 0.68 | 7.01 |
| Example 2 | A-2 | 1:1 | — | LiF | Al | 13.71 | 0.81 | 0.65 | 7.22 |
| | | 1:1.5 | — | LiF | Al | 14.04 | 0.81 | 0.66 | 7.51 |
| Example 3 | A-3 | 1:1 | — | LiF | Al | 13.71 | 0.73 | 0.68 | 6.81 |
| | | 1:1.5 | — | LiF | Al | 13.94 | 0.73 | 0.68 | 6.92 |
| Example 4 | A-4 | 1:1 | — | LiF | Al | 13.75 | 0.76 | 0.68 | 7.11 |
| | | 1:1.5 | — | LiF | Al | 13.42 | 0.76 | 0.67 | 6.83 |
| Comparative Example 1 | B-1 | 1:1 | — | LiF | Al | 11.20 | 0.74 | 0.59 | 4.89 |
| | | 1:1.5 | — | LiF | Al | 12.74 | 0.74 | 0.66 | 6.39 |
| Comparative Example 2 | B-2 | 1:1 | — | LiF | Al | 11.44 | 0.74 | 0.62 | 5.25 |
| | | 1:1.5 | — | LiF | Al | 11.22 | 0.74 | 0.60 | 4.98 |
| Comparative Example 3 | B-3 | 1:1 | — | LiF | Al | 11.19 | 0.68 | 0.57 | 4.34 |
| | | 1:1.5 | — | LiF | Al | 12.56 | 0.68 | 0.55 | 4.70 |
| Comparative Example 4 | B-4 | 1:1 | — | LiF | Al | 13.51 | 0.74 | 0.59 | 5.90 |
| | | 1:1.5 | — | LiF | Al | 15.02 | 0.74 | 0.61 | 6.78 |
| Example 5 | A-1 | 1:1.2 | — | LiF | Al | 14.08 | 0.77 | 0.69 | 7.52 |
| Example 6 | A-1 | 1:1.2 | ZnO | — | Al | 14.95 | 0.77 | 0.66 | 7.63 |
| Example 7 | A-1 | 1:1.2 | E-1 | — | Al | 14.89 | 0.79 | 0.69 | 8.13 |
| Example 8 | A-1 | 1:1.2 | E-2 | — | Al | 14.63 | 0.78 | 0.72 | 8.17 |
| Example 9 | A-1 | 1:1.2 | E-2 | — | Ag | 15.26 | 0.77 | 0.70 | 8.20 |
| Example 10 | A-1 | 1:1.2 | E-2 | LiF | Ag | 15.36 | 0.78 | 0.71 | 8.50 |
| Example 11 | A-1 | 1:1.2 | E-3 | — | Al | 14.55 | 0.78 | 0.69 | 7.87 |
| Example 12 | A-1 | 1:1.2 | E-4 | — | Al | 14.17 | 0.76 | 0.72 | 7.79 |
| Example 13 | A-1 | 1:1.2 | E-5 | LiF | Al | 14.61 | 0.78 | 0.70 | 7.93 |
| Example 14 | A-1 | 1:1.2 | E-5 | LiF | Ag | 14.67 | 0.77 | 0.70 | 7.93 |
| Example 15 | A-1 | 1:1.2 | E-6 | LiF | Al | 14.96 | 0.78 | 0.70 | 8.15 |

As is evident from Table 1, the photovoltaic devices (Examples 1 to 4) prepared from the electron donating organic material using the conjugated polymer having a structure represented by formula (1) exhibited higher photoelectric conversion efficiency than other photovoltaic devices (Comparative Examples 1 to 4) prepared in the same conditions.

Example 5

The compound (A-1) (0.9 mg) and $PC_{70}BM$ (1.1 mg) (produced by Solenne BV) were added to 0.20 ml of a chloroform solution containing 1,8-diiodooctane (produced by Wako Pure Chemical Industries, Ltd.) at a rate of 2% by volume, and a container containing the chloroform solution was irradiated with ultrasonic waves for 30 minutes in a ultrasonic cleaning machine (US-2 (trade name) manufactured by Iuchi Seieido Co., Ltd., output: 120 W) to obtain a solution C (a weight ratio between a donor and an acceptor is 1:1.2).

A photovoltaic device having an area of 5 mm×5 mm was prepared, and the current-voltage characteristics were measured in the same manner as in Example 1 except for vapor-depositing a lithium fluoride layer at a thickness of 0.5 nm. The short-circuit current density was 14.08 mA/cm$^2$, the open circuit voltage was 0.77 V, and the fill factor (FF) was 0.69, and the photoelectric conversion efficiency calculated based on these values was 7.52%.

Example 6

After the above-mentioned cleaned substrate was subjected to a UV/ozone treatment for 30 minutes, a solution which was formed by dissolving zinc acetate dihydrate (20 mg) (produced by Wako Pure Chemical Industries, Ltd.) in a mixed solvent (1 ml) of ethanol and water (100:1) was applied onto the substrate by spin coating at 1500 rpm, and heated at 200° C. for 1 hour on a hot plate. After heating, the resulting coated substrate was cooled to room temperature, and a solution formed by dissolving 0.5 mg of sodium myristate (produced by Tokyo Chemical Industry Co., Ltd.) in 1 ml of ethanol was applied onto the coated substrate by spin coating at 1000 rpm, and the solution was heated at 110° C. for 10 minutes on a hot plate to form an electron transporting layer. The above-mentioned solution C was added dropwise to the electron transporting layer, and an organic semiconductor layer having a thickness of 130 nm was formed by a spin coating method. Thereafter, the substrate with the organic semiconductor layer formed thereon and a mask for a negative electrode were placed in a vacuum vapor deposition apparatus, and the apparatus was again evacuated until the degree of vacuum inside the apparatus reached 1×10$^{-3}$ Pa or less and a molybdenum oxide layer was vapor-deposited with a thickness of 10 nm by a resistive heating method. Thereafter, an aluminum layer serving as a negative electrode was vapor-deposited at a thickness of 80 nm. As described above, a photovoltaic device, in which an area of an intersection portion of the stripe-shaped ITO layer and the stripe-shaped aluminum layer is 5 mm×5 mm, was prepared, and the current-voltage characteristics were measured. The short-circuit current density was 14.95 mA/cm$^2$, the open circuit voltage was 0.77 V, and the fill factor (FF) was 0.66, and the photoelectric conversion efficiency calculated based on these values was 7.63%.

Synthesis Example 9

A compound E-1 was synthesized by the following method. 1,10-phenanthroline (9.64 g) was reacted with phenyl lithium (100 ml) (1.07 M cyclohexane/ether solution) at 0° C. for 1.5 hours in toluene (250 ml) and treated by a conventional method. The resulting product was reacted with manganese dioxide (93.0 g) at room temperature for 56 hours in dichloromethane (300 ml) and treated by a conventional method to obtain 9.44 g of 2-phenyl-1,10-phenanthroline. To 25 ml of a THF solution of 1,3-dibromobenzene (0.34 ml) was added an t-butyl lithium (1.53 M pentane solution) (7.35 mL) at −78° C., and the resulting mixture was stirred for 1 hour, and then its temperature was raised to 0° C. The resulting solution was added to 85 ml of a THF solution of the obtained 2-phenyl-1,10-phenanthroline (1.44 g), and the resulting mixture was stirred at room temperature for 20 hours, and treated by a conventional method. The resulting product was reacted with manganese dioxide (8.50 g) at room temperature for 23 hours in dichloromethane (85 ml) and treated by a conventional method to obtain 1.08 g of a compound E-1.

Synthesis Example 10

A compound E-2 was synthesized by the following method. 1,3-diacetylbenzene (5.0 g) and 8-amino-7-quinolinecarbaldehyde (11.1 g) were dissolved in ethanol (180 ml) in a nitrogen atmosphere, and to this was added dropwise an ethanol solution (130 ml) of potassium hydroxide (8.52 g) while stirring the resulting mixture. The resulting mixture was refluxed for 11 hours, and then the resulting product was treated by a conventional method to obtain 11.0 g of a compound E-2.

Synthesis Example 11

A compound E-6 was synthesized by the following method. 2,2'-biphenol (11 g) was dissolved in dichloromethane (100 ml) and pyridine (23.8 ml) in a nitrogen atmosphere, and to this was added dropwise trifluoromethane sulfonic acid anhydride (35 g) at 0° C. The resulting mixture was stirred at 0° C. for 2 hours and then treated by a conventional method to obtain 26.3 g of 2,2'-bis(trifluoromethanesulfonyloxyphenyl)biphenyl. To acetonitrile (100 ml) were added 2,2'-bis(trifluoromethanesulfonyloxyphenyl)biphenyl (10 g), 4-acetylphenylboronic acid (10.92 g), cesium fluoride (16.78 g), and tetrakis(triphenyl phosphine)palladium (1.28 g) in a nitrogen atmosphere, the resulting mixture was refluxed for two days and treated by a conventional method to obtain 5.59 g of 2,2'-di(4-acetylphenyl)biphenyl. A compound E-6 (4.9 g) was prepared from this 2,2'-di(4-acetylphenyl)biphenyl and 8-amino-7-quinolinecarbaldehyde (2.78 g) by the same reaction treatment as in Synthesis Example 10.

In addition, the E-1, E-2 and E-6 were used after purification by sublimation.

Example 7

A photovoltaic device having an area of 5 mm×5 mm was prepared, and the current-voltage characteristics were measured in the same manner as in Example 5 except for using the compound E-1 (5 nm) in place of the lithium fluoride (0.1 nm). The short-circuit current density was 14.89 mA/cm$^2$, the open circuit voltage was 0.79 V, and the fill factor (FF) was 0.69, and the photoelectric conversion efficiency calculated based on these values was 8.13%.

Example 8

A photovoltaic device having an area of 5 mm×5 mm was prepared, and the current-voltage characteristics were measured in the same manner as in Example 7 except for using the compound E-2 in place of the compound E-1. The short-circuit current density was 14.63 mA/cm$^2$, the open circuit voltage was 0.78 V, and the fill factor (FF) was 0.72, and the photoelectric conversion efficiency calculated based on these values was 8.17%.

Example 9

A photovoltaic device having an area of 5 mm×5 mm was prepared, and the current-voltage characteristics were measured in the same manner as in Example 7 except for using the compound E-2 in place of the compound E-1 and using silver in place of aluminum. The short-circuit current density was 15.26 mA/cm², the open circuit voltage was 0.77 V, and the fill factor (FF) was 0.70, and the photoelectric conversion efficiency calculated based on these values was 8.20%.

Example 10

A photovoltaic device having an area of 5 mm×5 mm was prepared, and the current-voltage characteristics were measured in the same manner as in Example 7 except for using the compound E-2 (5 nm)/LiF (0.5 nm) in place of the compound E-1 (5 nm) and using silver in place of aluminum. The short-circuit current density was 15.36 mA/cm², the open circuit voltage was 0.78 V, and the fill factor (FF) was 0.71, and the photoelectric conversion efficiency calculated based on these values was 8.50%.

Example 11

A photovoltaic device having an area of 5 mm×5 mm was prepared, and the current-voltage characteristics were measured in the same manner as in Example 7 except for using the compound E-3 (8-hydroxyquinolinolato-lithium (Liq) produced by Luminescence Technology Corporation) (2.5 nm) in place of the compound E-1 (5 nm). The short-circuit current density was 14.55 mA/cm², the open circuit voltage was 0.78 V, and the fill factor (FF) was 0.69, and the photoelectric conversion efficiency calculated based on these values was 7.87%.

Example 12

A photovoltaic device having an area of 5 mm×5 mm was prepared, and the current-voltage characteristics were measured in the same manner as in Example 7 except for using the compound E-4 (Phenyl-dipyrenylphosphine oxide(PoPy2) produced by Luminescence Technology Corporation) (2.5 nm) in place of the compound E-1 (5 nm). The short-circuit current density was 14.17 mA/cm², the open circuit voltage was 0.76 V, and the fill factor (FF) was 0.72, and the photoelectric conversion efficiency calculated based on these values was 7.79%.

Example 13

A photovoltaic device having an area of 5 mm×5 mm was prepared, and the current-voltage characteristics were measured in the same manner as in Example 7 except for using the compound E-5 (2,9-dimethyl-4,7-diphenyl-1,10-phenanthroline (BCP) produced by Luminescence Technology Corporation) (5 nm)/LiF (0.5 nm) in place of the compound E-1 (5 nm). The short-circuit current density was 14.61 mA/cm², the open circuit voltage was 0.78 V, and the fill factor (FF) was 0.70, and the photoelectric conversion efficiency calculated based on these values was 7.93%.

Example 14

A photovoltaic device having an area of 5 mm×5 mm was prepared, and the current-voltage characteristics were measured in the same manner as in Example 7 except for using the compound E-5 (5 nm)/LiF (0.5 nm) in place of the compound E-1 (5 nm) and using silver in place of aluminum. The short-circuit current density was 14.67 mA/cm², the open circuit voltage was 0.77 V, and the fill factor (FF) was 0.70, and the photoelectric conversion efficiency calculated based on these values was 7.93%.

Example 15

A photovoltaic device having an area of 5 mm×5 mm was prepared, and the current-voltage characteristics were measured in the same manner as in Example 7 except for using the compound E-6 (5 nm)/LiF (0.5 nm) in place of the compound E-1 (5 nm). The short-circuit current density was 14.96 mA/cm², the open circuit voltage was 0.78 V, and the fill factor (FF) was 0.70, and the photoelectric conversion efficiency calculated based on these values was 8.15%.

As is evident from Table 1, the photovoltaic devices (Examples 6 to 15) having the electron transporting layer between the negative electrode and the layer of the material for a photovoltaic device exhibited higher photoelectric conversion efficiency than the photovoltaic device (Example 5) not having the electron transporting layer. Moreover, when the phenanthroline derivative was used for the electron transporting layer material, (Examples 7 to 10 and 13 to 15) the product exhibited higher photoelectric conversion efficiency than when other materials were used for the electron transporting layer (Examples 11 and 12), and when the phenanthroline dimer compounds were used for the electron transporting layer (Examples 7 to 10 and 15), the product exhibited particularly high photoelectric conversion efficiency.

The invention claimed is:

1. A conjugated polymer having a structure represented by formula (1):

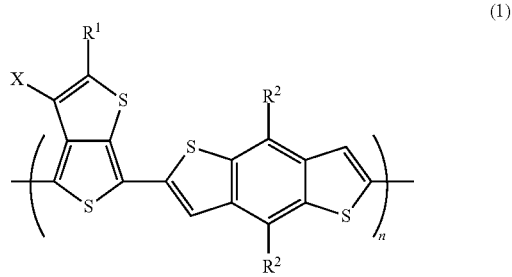

(1)

wherein $R^1$ represents an alkoxycarbonyl group in which an alkyl group part is a straight chain alkyl group or an alkanoyl group in which an alkyl group part is a straight chain alkyl group, and the groups may be substituted as long as they maintain a straight chain structure; each of $R^2$s which may be the same or different represents an optionally substituted heteroaryl group; X represents a hydrogen atom or a halogen atom, n is a polymerization degree and represents an integer of 2 or more and 1000 or less.

2. The conjugated polymer according to claim 1, wherein X is fluorine.

3. An electron donating organic material comprising the conjugated polymer according to claim 1.

4. A material for a photovoltaic device containing the electron donating organic material according to claim 3 and an electron accepting organic material.

5. The material according to claim 4, wherein the electron accepting organic material is a fullerene compound.

6. The material according to claim 5, wherein the fullerene compound contains a $C_{70}$ derivative.

7. A photovoltaic device comprising at least a positive electrode and a negative electrode, wherein the photovoltaic device has an organic semiconductor layer containing the material for the photovoltaic device according to claim 4 between the positive electrode and the negative electrode.

8. The photovoltaic device according to claim 7, further comprising an electron transporting layer between the negative electrode and the organic semiconductor layer containing the material for the photovoltaic device.

9. The photovoltaic device according to claim 8, wherein the electron transporting layer contains a phenanthroline derivative.

10. An electron donating organic material comprising the conjugated polymer according to claim 2.

11. A material for a photovoltaic device containing the electron donating organic material according to claim 10 and an electron accepting organic material.

12. A photovoltaic device comprising at least a positive electrode and a negative electrode, wherein the photovoltaic device has an organic semiconductor layer containing the material for the photovoltaic device according to claim 5 between the positive electrode and the negative electrode.

13. A photovoltaic device comprising at least a positive electrode and a negative electrode, wherein the photovoltaic device has an organic semiconductor layer containing the material for the photovoltaic device according to claim 6 between the positive electrode and the negative electrode.

* * * * *